(12) United States Patent
Yasuoka et al.

(10) Patent No.: US 7,790,554 B2
(45) Date of Patent: Sep. 7, 2010

(54) METHOD OF MANUFACTURING SEMICONDUCTOR INTEGRATED CIRCUIT DEVICE WITH HIGH AND LOW BREAKDOWN-VOLTAGE MISFETS

(75) Inventors: Hideki Yasuoka, Musashino (JP);
Masami Kouketsu, Hachioji (JP);
Susumu Ishida, Tachikawa (JP);
Kazunari Saitou, Mobara (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/432,393

(22) Filed: Apr. 29, 2009

(65) Prior Publication Data

US 2009/0209078 A1      Aug. 20, 2009

Related U.S. Application Data

(60) Continuation of application No. 11/614,469, filed on Dec. 21, 2006, now Pat. No. 7,541,661, which is a division of application No. 10/894,019, filed on Jul. 20, 2004, now Pat. No. 7,224,037, which is a continuation of application No. 10/327,859, filed on Dec. 26, 2002, now abandoned, which is a continuation of application No. 09/989,061, filed on Nov. 21, 2001, now Pat. No. 6,780,717.

(30) Foreign Application Priority Data

Nov. 30, 2000      (JP)      ............... 2000-364146

(51) Int. Cl.
*H01L 21/77* (2006.01)
(52) U.S. Cl. ............... 438/275; 257/E21.598
(58) Field of Classification Search ............ 438/221, 438/223, 224, 275, 294, 296, 424, 426; 257/E21.598
See application file for complete search history.

(56) References Cited

U.S. PATENT DOCUMENTS 3,793,090 A      2/1974      Barile et al.

(Continued)

FOREIGN PATENT DOCUMENTS

JP      01-137441 A      5/1989

(Continued)

*Primary Examiner*—Marcos D. Pizarro
(74) *Attorney, Agent, or Firm*—Miles & Stockbridge P.C.

(57) ABSTRACT

Provided is a manufacturing method of a semiconductor integrated circuit device having a plurality of first MISFETs in a first region and a plurality of second MISFETs in a second region, which comprises forming a first insulating film between two adjacent regions of the first MISFET forming regions in the first region and the second MISFET forming regions in the second region; forming a second insulating film over the surface of the semiconductor substrate between the first insulating films in each of the first and second regions; depositing a third insulating film over the second insulating film; forming a first conductive film over the third insulating film in the second region; forming, after removal of the third and second insulating films from the first region, a fourth insulating film over the surface of the semiconductor substrate in the first region; and forming a second conductive film over the fourth insulating film; wherein the third insulating film remains over the first insulating film in the second region. The present invention makes it possible to raise the threshold voltage of a parasitic MOS and in addition, to suppress occurrence of an NBT phenomenon.

6 Claims, 25 Drawing Sheets

U.S. PATENT DOCUMENTS

| | | | |
|---|---|---|---|
| 4,672,416 A | 6/1987 | Nakazato et al. | |
| 5,489,545 A | 2/1996 | Taguchi | |
| 5,910,673 A | 6/1999 | Hsu et al. | |
| 5,936,384 A | 8/1999 | Fujiwara et al. | |
| 5,960,289 A | 9/1999 | Tsui et al. | |
| 6,091,113 A | 7/2000 | Tanaka | |
| 6,114,741 A | 9/2000 | Joyner et al. | |
| 6,117,725 A | 9/2000 | Huang | |
| 6,376,316 B2 | 4/2002 | Shukuri et al. | |

FOREIGN PATENT DOCUMENTS

| | | | |
|---|---|---|---|
| JP | 02-067765 A | | 3/1990 |
| JP | 6-29313 | | 2/1994 |
| JP | 08-264779 A | | 10/1996 |
| JP | 10-135448 | | 5/1998 |
| JP | 11-003946 | | 6/1999 |
| JP | 11-177047 A | | 7/1999 |
| JP | 11177047 A | * | 7/1999 |
| JP | 11-354647 | | 12/1999 |
| JP | 2000-068385 A | | 3/2000 |
| JP | 2000-68385 A | | 3/2000 |
| JP | 2000068385 A | * | 3/2000 |
| JP | 2000-138347 A | | 5/2000 |
| JP | 2000-307012 A | | 11/2000 |
| JP | 2001-118933 | | 4/2001 |

* cited by examiner

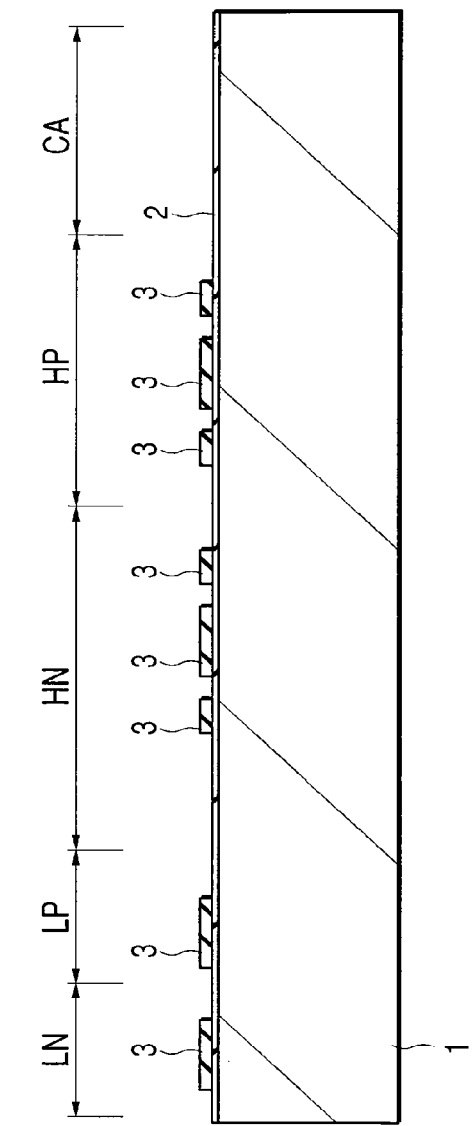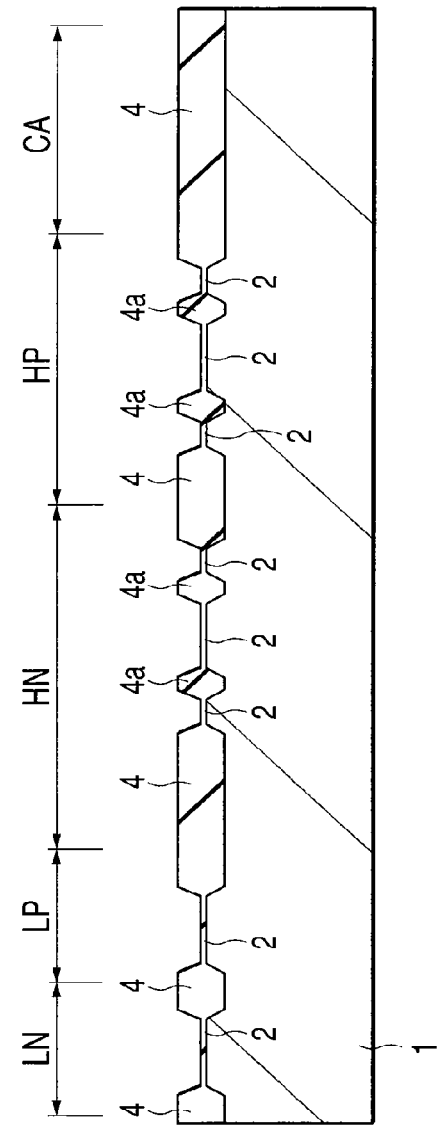

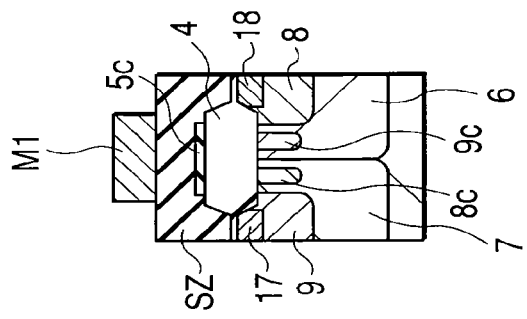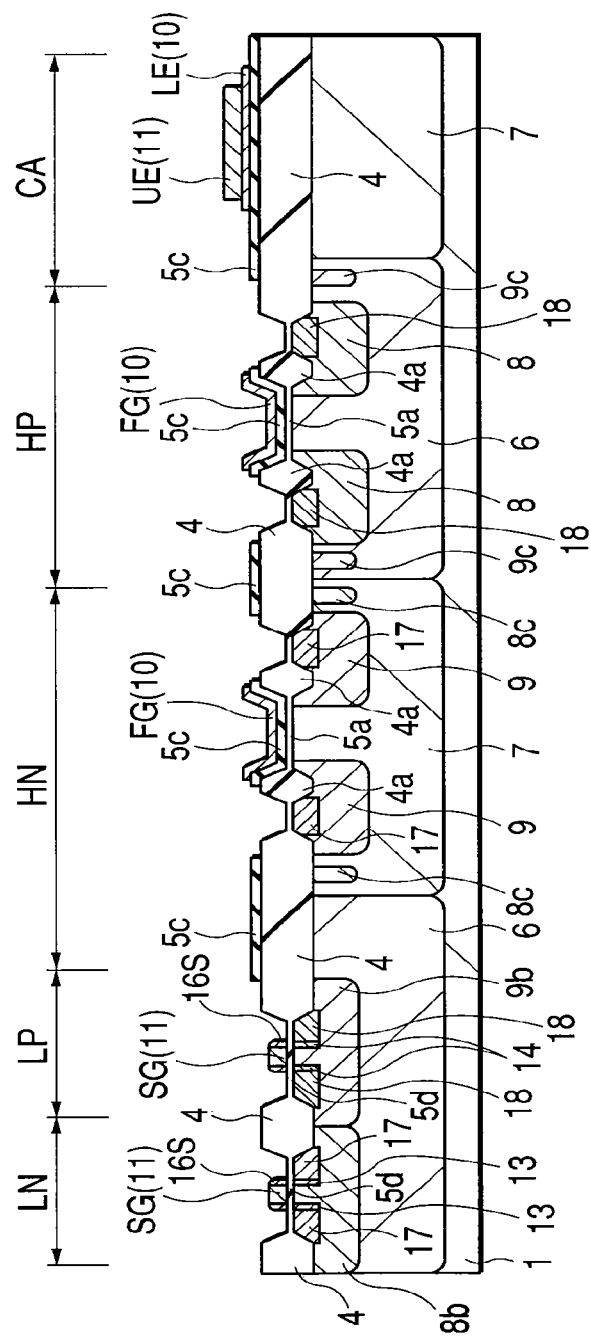

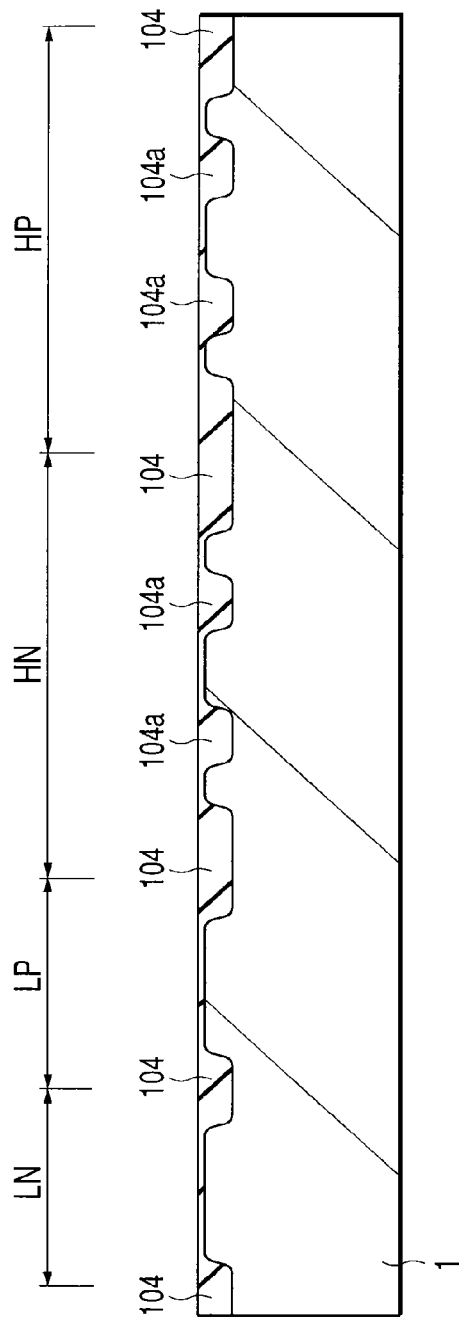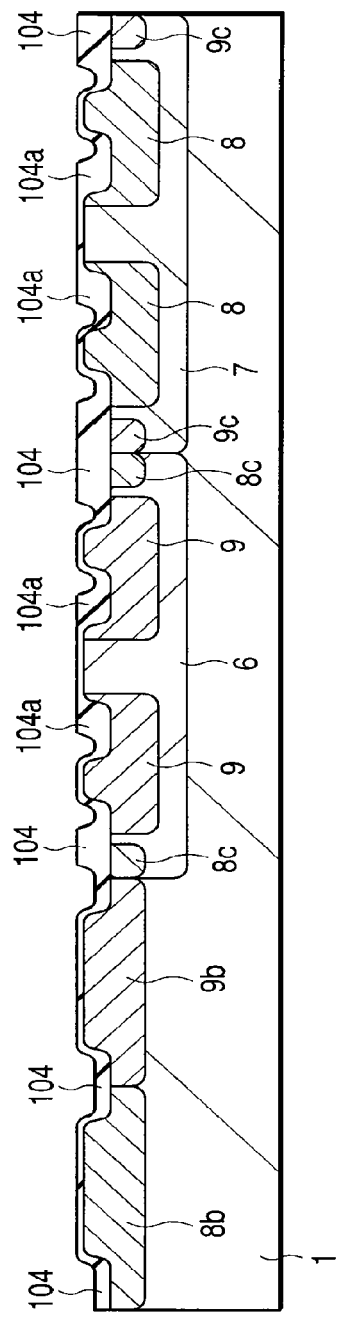
FIG. 26(a)
FIG. 26(b)

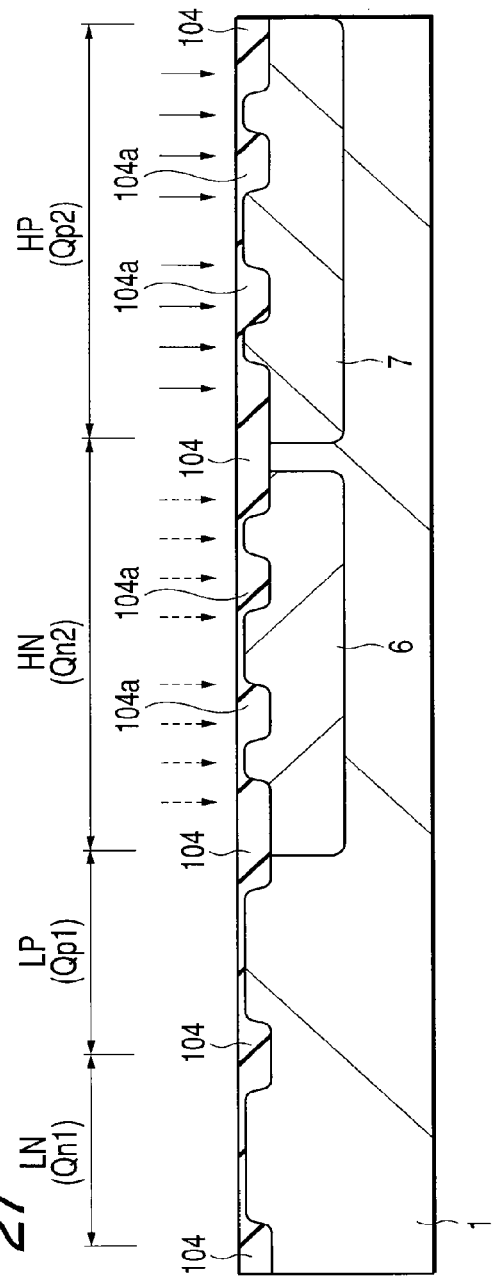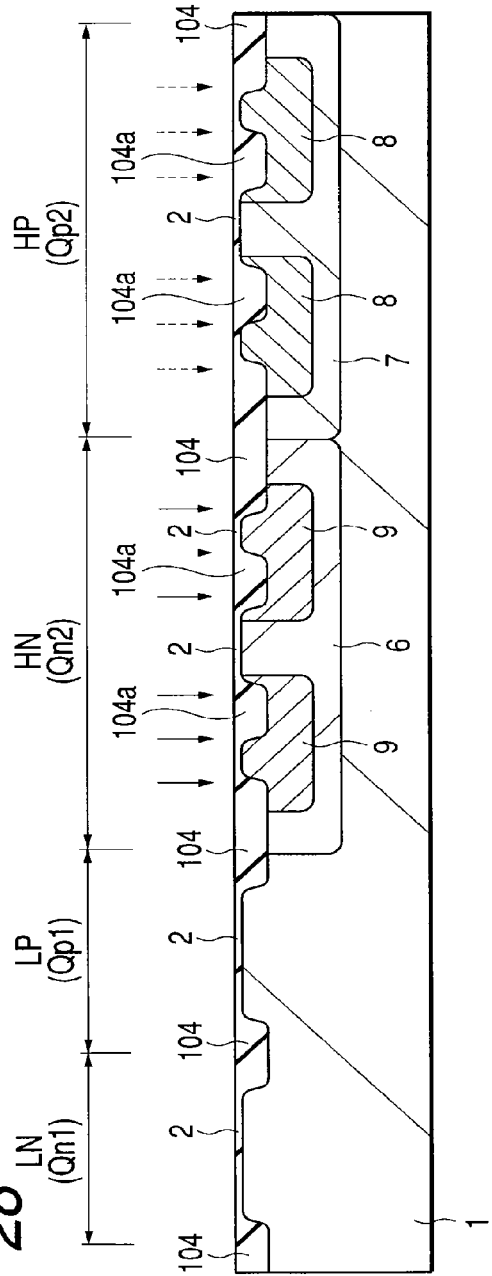

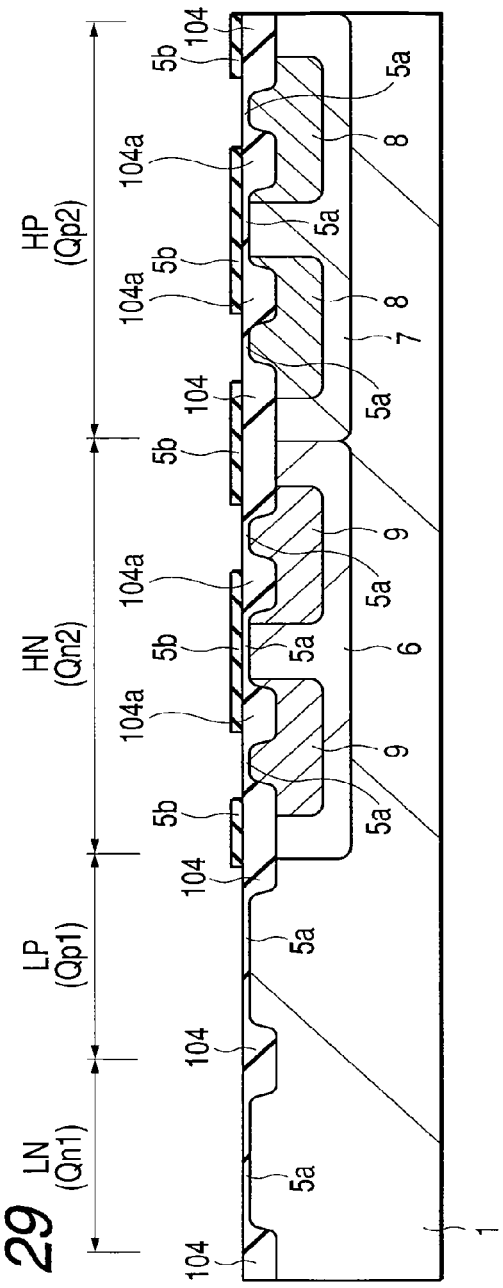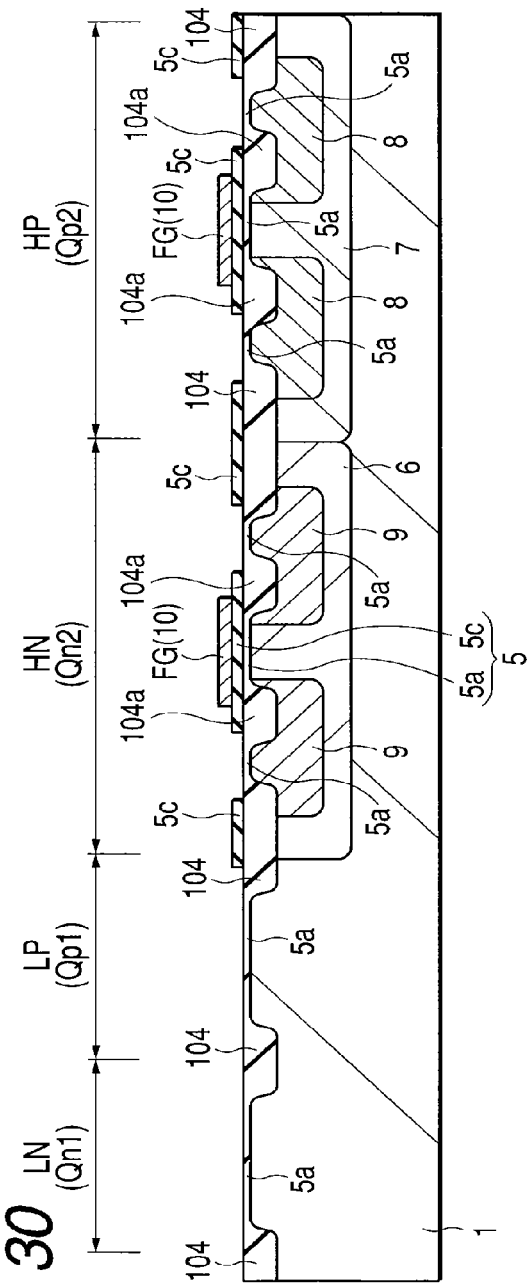

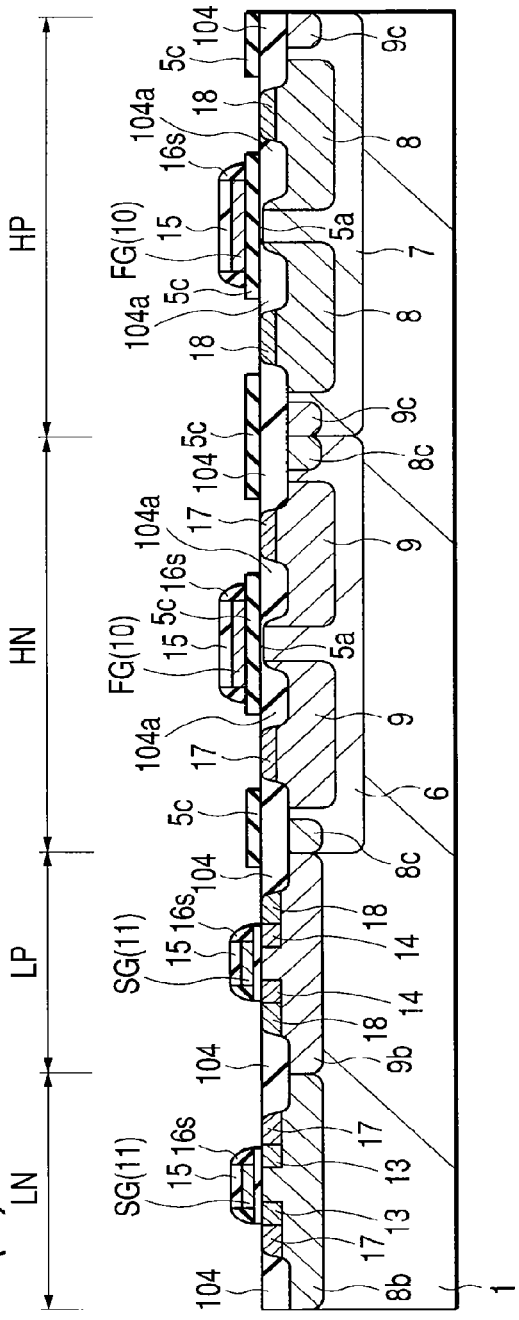
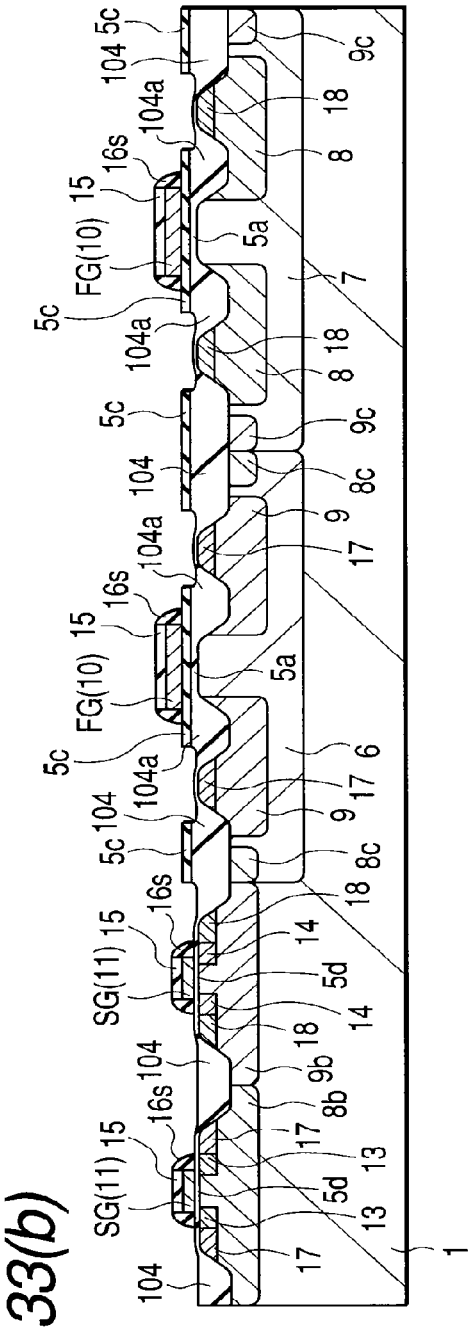
FIG. 33(a)
FIG. 33(b)

METHOD OF MANUFACTURING SEMICONDUCTOR INTEGRATED CIRCUIT DEVICE WITH HIGH AND LOW BREAKDOWN-VOLTAGE MISFETS

CROSS-REFERENCE TO RELATED APPLICATIONS

This application is a continuation of application Ser. No. 11/614,469 filed Dec. 21, 2006, now U.S. Pat. No. 7,541,661 which is a division of application Ser. No. 10/894,019 filed Jul. 20, 2004 (now U.S. Pat. No. 7,224,037 issued May 29, 2007), which is a continuation of application Ser. No. 10/327,859 filed Dec. 26, 2002 (now abandoned), which is a continuation of application Ser. No. 09/989,061 filed Nov. 21, 2001 (now U.S. Pat. No. 6,780,717 issued Aug. 24, 2004).

BACKGROUND OF THE INVENTION

The present invention relates to a semiconductor integrated circuit device and a method of manufacturing the same. More particularly, it relates to a semiconductor integrated circuit device having an MISFET (Metal Insulator Semiconductor Field Effect Transistor) having a high breakdown voltage and that having a low breakdown voltage on the same semiconductor substrate, and a method of manufacturing the same.

The MISFET having a high breakdown voltage is used for a driver of a liquid crystal display, a motor control driver for controlling a high electric current or a non-volatile memory which requires high voltage for programming.

This MISFET having a high breakdown voltage is designed to increase the breakdown voltage in various ways, for example, by thickening a gate insulating film.

In Japanese Patent Application Laid-Open No. Hei 11 (1999)-177047, described is a technique of forming the gate insulating film 10 of one of a plurality of electric field effect transistors different in thickness of a gate insulating film with a laminate of a thermal oxide film 8 and a deposited film 9.

In Japanese Patent Application Laid-Open No. 2000-68385 (corresponding to U.S. patent Ser. No. 09/208,019), described is a technique of simultaneously forming a electric field relaxing region NW (FD) of a high breakdown voltage NMOS transistor and a channel stopper NW (CS) in a well region NW of a low breakdown voltage PMOS transistor and in a well HNW region of a high breakdown voltage PMOS transistor.

SUMMARY OF THE INVENTION

The present inventors investigated an improvement in drain breakdown voltage by disposing electric field relaxation layers 9,8 in the vicinity of source-drain regions 17,18 of a high breakdown voltage MISFET (Qn2,Qp2) as illustrated in FIG. 40.

In the structure of MISFET as illustrated in FIG. 40, however, owing to thinness of a gate insulating film 5 below a gate electrode FG, the gate insulating film was broken at its end portions, making it impossible to maintain a breakdown voltage. In addition, since the electric field relaxation layers 9,8 were separately disposed at both ends of the source-drain regions 17,18, electric field effect concentration tended to occur on the boundary between the electric field relaxation layer and source-drain regions. As a result, problems such as lowering in drain breakdown voltage or lowering in electrostatic breakdown strength occurred.

In order to relax electric field effect concentration on the boundary between the electric field relaxation layer and source-drain regions, thereby solving one of the above-described problems, a structure, as illustrated in FIG. 41, of covering the source-drain regions 17,18 with the electric field relaxation layers 9,8 was investigated. The problem, that is, lowering in breakdown voltage due to breakage of the gate insulating film 5 at the end portions of the gate electrode has not yet been solved.

An improvement in breakdown voltage by disposing a field oxide film 4a at the end portions of the gate electrode FG as illustrated in FIG. 42 was investigated, but failed to relax electric field effect concentration on the boundary between the electric field relaxation layers 9,8 and source-drain regions 17,18.

Functions of the members illustrated in FIGS. 40 to 42 are presumed to become apparent later by Embodiments of the present invention so that a detailed description is omitted.

An object of the present invention is to provide a miniaturized structure of high breakdown voltage MISFET and a manufacturing method of the structure.

Another object of the present invention is to provide a high breakdown voltage MISFET structure suppressed in the influence of a parasitic MOS and a manufacturing method of the structure.

A further object of the present invention is to provide a structure of a high breakdown voltage MISFET having a high performance and a manufacturing method of the structure.

The above-described and the other objects, and novel features of the present invention will be apparent from the description herein and accompanying drawings.

Among the aspects of the invention disclosed by the present application, some principal ones will next be described.

In a first aspect of the present invention, there is thus provided a manufacturing method of a semiconductor integrated circuit device, which comprises forming a first insulating film between two adjacent regions of first MISFET forming regions and second MISFET forming regions, forming second and third insulating films on the surface of a semiconductor substrate between the first insulating films, forming a first conductive film over the third insulating film of a second region wherein the second MISFET is to be formed, forming a fourth insulating film in a first region wherein the first MISFET is to be formed after removal of the third and second insulating films over the first region, and forming a second conductive film over the fourth insulating film, wherein the third insulating film remains over the first insulating film of the second region.

In a second aspect of the present invention, there is also provided a method of a semiconductor integrated circuit device which comprises forming a first insulating film between two adjacent regions of first MISFET forming regions and second MISFET forming regions, forming a first semiconductor region and a second semiconductor region in a first region wherein the first MISFET is to be formed and in a second region wherein the second MISFET is to be formed, respectively, forming second and third insulating films in the first and second regions, removing the third and second insulating films from the first region and removing a portion of the second and third insulating films over the second semiconductor region in the second region, thereby forming a first opening portion, forming a first conductive film to be a gate electrode of the second MISFET over the third insulating film in the second region, forming a fourth insulating film in the first region, forming a second conductive film to be a gate electrode of the first MISFET over the fourth insulating film, and introducing an impurity into a surface of the semiconductor substrate in order to form a third semiconductor region having a conductivity type contrary to that of the first semiconductor region on both sides of the gate electrode of the first region and to form a fourth semiconductor region having the same conductivity type as that of the second semiconductor region below the first opening in the second region.

In a third aspect of the present invention, there is also provided a manufacturing method of a semiconductor integrated circuit device, which comprises forming a first insulating film in a first region wherein a first MISFET is to be formed and a second region wherein a second MISFET is to be formed, depositing a first conductive film over the first insulating film in the first and second regions, removing the first insulating film and first conductive film from the first region, forming a second insulating film in the first region over the semiconductor substrate, depositing a second conductive film over the first and second regions, and implanting an impurity downward from a position above the second conductive film into the first and second regions at an energy permitting the impurity to reach the substrate of the first region.

In a fourth aspect of the present invention, there is also provided a semiconductor integrated circuit device comprising a first insulating film lying between two adjacent regions of first MISFET forming regions in a first region wherein a first MISFET is to be formed and second MISFET forming regions in a second region wherein a second MISFET is to be formed, a second insulating film formed in the second region, a third insulating film formed over the first insulating film and second insulating film in the second region, a first conductive film over the third insulating film in the second region, a fourth insulating film formed in the first region, and a second conductive film formed over the fourth insulating film in the first region.

In a fifth aspect of the present invention, the semiconductor integrated circuit device further comprises a second semiconductor region formed in the semiconductor substrate of the second region and having a conductivity type contrary to that of the first semiconductor region formed in the first region, a third insulating film having a first opening over the second semiconductor region in the second region and formed over the first and second insulating films and a fourth semiconductor region of the same conductivity type formed below the first opening and in the second semiconductor region.

In a sixth aspect of the present invention, there is also provided a semiconductor integrated circuit device comprising a first insulating film lying between two adjacent regions of MISFET forming regions in each of a first region wherein a first MISFET is to be formed and a second region wherein a second MISFET is to be formed, a second insulating film formed over the surface of the semiconductor substrate in the second region, a third insulating film formed in the second region, a first conductive film formed over the third insulating film in the second region, a fourth insulating film formed over the surface of the semiconductor substrate in the first region and a second conductive film formed over the fourth insulating film in the first region.

BRIEF DESCRIPTION OF THE DRAWINGS

FIG. 1 is a fragmentary cross-sectional view of a substrate illustrating a manufacturing method of a semiconductor integrated circuit device according to Embodiment 1 of the present invention;

FIG. 2 is a fragmentary cross-sectional view of a substrate illustrating the manufacturing method of a semiconductor integrated circuit device according to Embodiment 1 of the present invention;

FIGS. 22(a) and 22(b) are fragmentary cross-sectional views of a substrate illustrating the manufacturing method of a semiconductor integrated circuit device according to Embodiment 1 of the present invention;

FIGS. 26(a) and 26(b) are fragmentary cross-sectional views of a substrate illustrating the manufacturing method of a semiconductor integrated circuit device according to Embodiment 2 of the present invention;

FIG. 27 is a fragmentary cross-sectional view of a substrate illustrating the manufacturing method of a semiconductor integrated circuit device according to Embodiment 2 of the present invention;

FIG. 28 is a fragmentary cross-sectional view of a substrate illustrating the manufacturing method of a semiconductor integrated circuit device according to Embodiment 2 of the present invention;

FIG. 29 is a fragmentary cross-sectional view of a substrate illustrating the manufacturing method of a semiconductor integrated circuit device according to Embodiment 2 of the present invention;

FIG. 30 is a fragmentary cross-sectional view of a substrate illustrating the manufacturing method of a semiconductor integrated circuit device according to Embodiment 2 of the present invention;

FIGS. 33(a) and 33(b) are fragmentary cross-sectional views of a substrate illustrating the manufacturing method of a semiconductor integrated circuit device according to Embodiment 2 of the present invention;

DETAILED DESCRIPTION OF THE PREFERRED EMBODIMENTS

Figure 3:
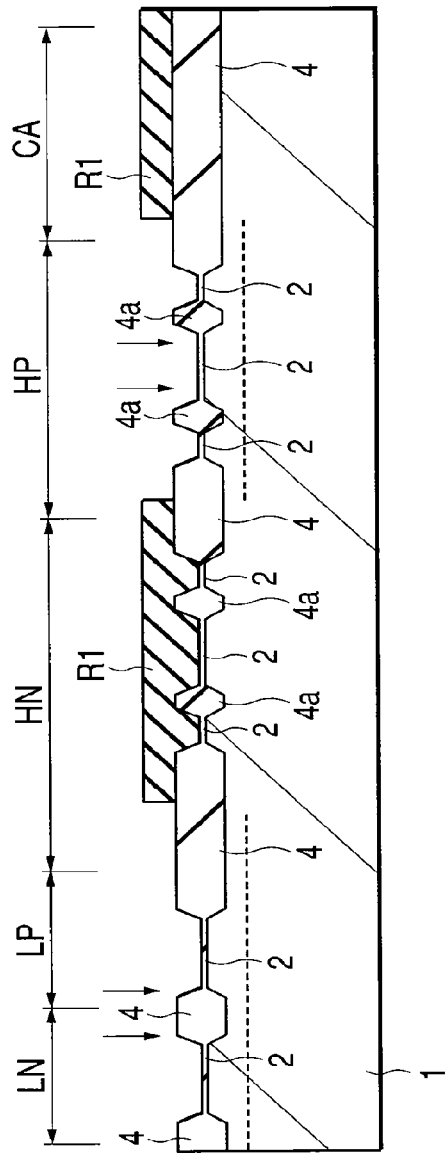
FIG. 3 is a fragmentary cross-sectional view of a substrate illustrating the manufacturing method of a semiconductor integrated circuit device according to Embodiment 1 of the present invention.

The embodiments of the present invention will hereinafter be described in detail based on accompanying drawings. In principle, in all the drawings for explaining embodiments, like members having the same function will be identified by like reference numerals and overlapping descriptions will be omitted.

Embodiment 1

A manufacturing method of a semiconductor integrated circuit device according to this Embodiment will be described in the order of steps based on FIGS. 1 to 22(b).

First, a semiconductor substrate 1 made of p type single crystal silicon as illustrated in FIG. 1 is prepared. This semiconductor substrate 1 has a region LN wherein a low breakdown voltage n channel type MISFETQn1 is to be formed, a region LP wherein a low breakdown voltage p channel type MISFETQp1 is to be formed, a region HN wherein a high breakdown voltage n channel type MISFETQn2 is to be formed, a region HP wherein a high breakdown voltage p channel type MISFETQp2 is to be formed and a region CA wherein a capacitive element C is to be formed.

By oxidizing the surface of this semiconductor substrate 1, a silicon oxide film 2 is formed. After selective formation of a silicon nitride film 3 over the silicon oxide film, thermal oxidation is effected with this silicon nitride film 3 as a mask, whereby a field oxide film 4 (first insulating film) of about 300 nm thick is formed as illustrated in FIG. 2. By this field oxide film 4, the MISFET forming regions LN, LP, HN and HP are separated each other. In the high breakdown voltage MISFETQn2,Qp2 forming regions (HN,HP), a field oxide film 4a is formed below both ends of a gate electrode FG which will be described later. This field oxide film 4a is formed for improving breakdown voltage of each of the high breakdown voltage MISFETQn2,Qp2. Then, the silicon nitride film 3 is removed from the semiconductor substrate 1 by wet etching with hot phosphoric acid.

As illustrated in FIG. 3, a resist film R1 is formed over the high breakdown voltage n channel type MISFET forming region HN and capacitive element forming region CA. With this resist film R1 as a mask, ion implantation of phosphorus is conducted. Ion implantation energy at this time is set so that phosphorus is implanted also below the field oxide films 4,4a in the low breakdown voltage n channel type MISFET forming region LN, low breakdown voltage p channel type MISFET forming region LP and high breakdown voltage p channel type MISFET forming region HP. The resist film R1 is then stripped (FIG. 4).

Figure 4:
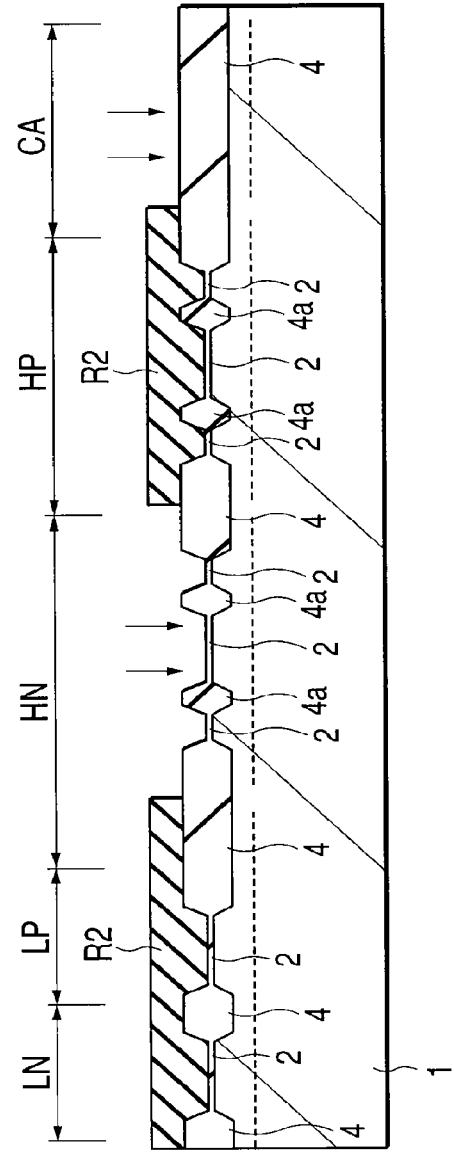
FIG. 4 is a fragmentary cross-sectional view of a substrate illustrating the manufacturing method of a semiconductor integrated circuit device according to Embodiment 1 of the present invention.
Figure 5:
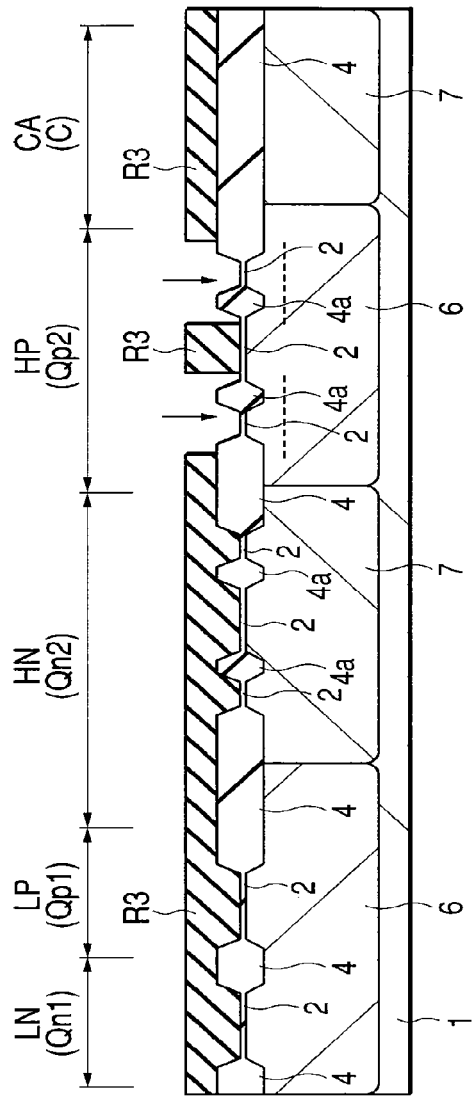
FIG. 5 is a fragmentary cross-sectional view of a substrate illustrating the manufacturing method of a semiconductor integrated circuit device according to Embodiment 1 of the present invention.

As illustrated in FIG. 4, a resist film R2 is formed over the low breakdown voltage n channel type MISFET forming region LN, low breakdown voltage p channel type MISFET forming region LP and high breakdown voltage p channel type MISFET forming region HP. With this resist film R2 as a mask, ion implantation of boron is conducted. The ion implanting energy at this time is set so that boron is also implanted below the field oxide films 4,4a in the high breakdown voltage n channel type MISFET forming region HN and capacitive element forming region CA. After removal of the resist film R2, an n type isolation region 6 (n type well 6) and a p type well 7 are formed by heat treatment at 1200° C. (FIG. 5). In this Embodiment, the p type well 7 is formed below the field oxide films 4,4a in the capacitive element forming region CA, but instead, another n type well 6 may be formed.

As illustrated in FIG. 5, a resist film R3 is formed over a region other than the vicinity of the source-drain regions of the high breakdown voltage p channel type MISFETQp2. With this resist film R3 as a mask, boron is ion-implanted. Ion implanting energy at this time is set so that boron is implanted also below the field oxide films 4,4a in the high breakdown voltage p channel type MISFET forming region HP.

Figure 6:
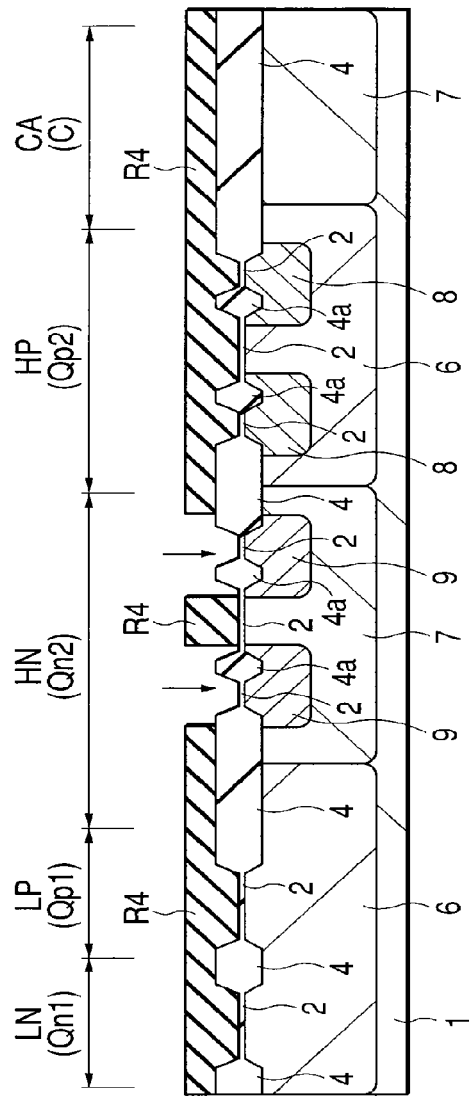
FIG. 6 is a fragmentary cross-sectional view of a substrate illustrating the manufacturing method of a semiconductor integrated circuit device according to Embodiment 1 of the present invention.

After removal of the resist film R3, a resist film R4 is formed over a region other than the vicinity of the source-drain regions of the high breakdown voltage n channel type MISFETQn2 as illustrated in FIG. 6. With this resist film R4 as a mask, phosphorus is ion-implanted. The ion implanting energy at this time is set so that phosphorus is implanted also below the field oxide films 4,4a in the high breakdown voltage n channel type MISFET forming region HN.

After removal of the resist film R4, heat treatment is conducted, whereby p type electric field relaxation layers 8 and n type electric field relaxation layers 9 are formed in the vicinity of the source-drain regions of the high breakdown voltage p channel type MISFETQp2 and in the vicinity of the source-drain regions of the high breakdown voltage n channel type MISFETQn2, respectively.

Figure 7:
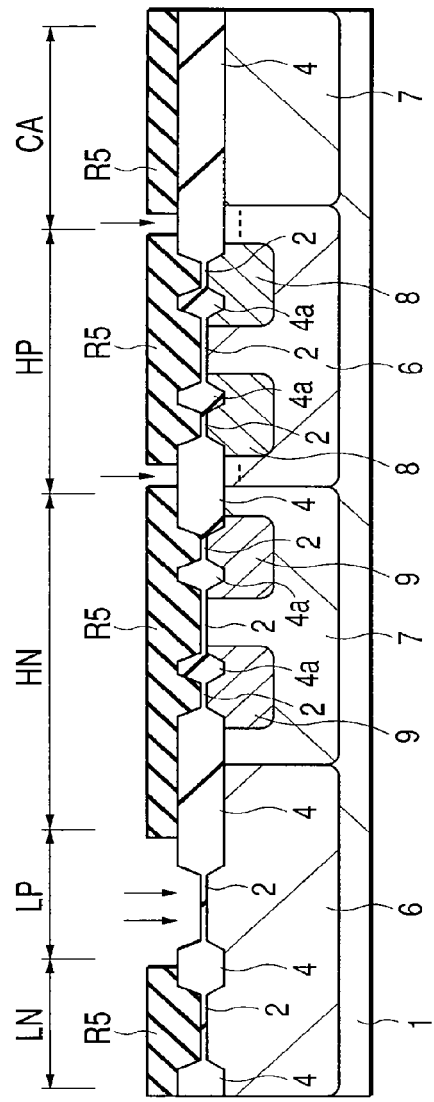
FIG. 7 is a fragmentary cross-sectional view of a substrate illustrating the manufacturing method of a semiconductor integrated circuit device according to Embodiment 1 of the present invention.
Figure 8:
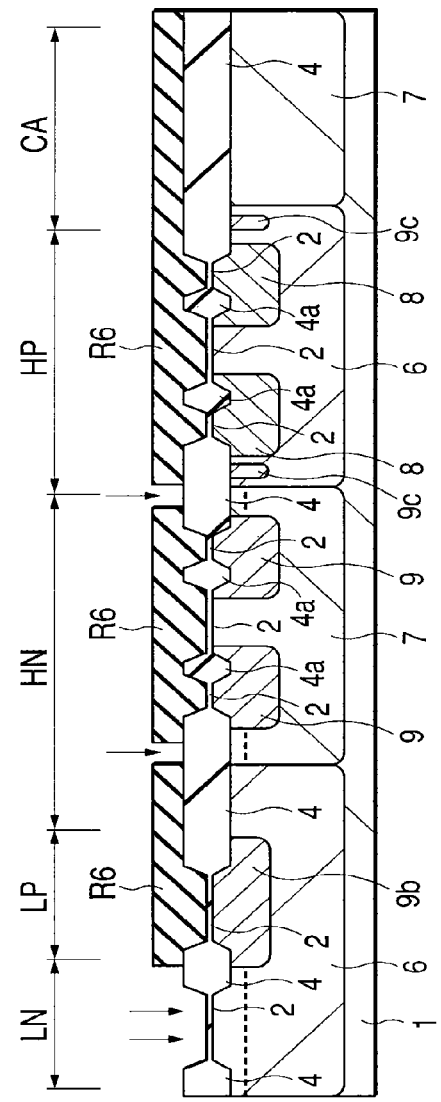
FIG. 8 is a fragmentary cross-sectional view of a substrate illustrating the manufacturing method of a semiconductor integrated circuit device according to Embodiment 1 of the present invention.

A resist film R5 is then formed over a region other than the low breakdown voltage p channel type MISFET forming region LP as illustrated in FIG. 7. With this resist film R5 as a mask, phosphorus is ion-implanted, followed by heat treatment, whereby an n type well 9b is formed. Upon ion implantation, an n type well 9c may be formed by ion implantation of phosphorus also below the field oxide film 4 in the high breakdown voltage p channel type MISFET forming region HP (FIG. 8). This n type well 9c serves to increase the threshold voltage Vt of a parasitic MOS (Metal Oxide Semiconductor) formed over the field oxide film 4. In particular, the impurity concentrations of the n type isolation region 6 and p type well 7 are set to become lower when they are closer to the surface of the semiconductor substrate 1, by which the breakdown voltage of the high breakdown voltage MISFETQn2, Qp2 formed over the main surface of them can be ensured. As a result, the threshold voltage Vt of the parasitic MOS has a lowering tendency. Here, the term "parasitic MOS" means an undesired MOS having—when a first-level interconnect is formed over the field oxide film 4 via an interlevel insulating film SZ (refer to FIG. 22(b))—the field oxide film 4 and interlevel insulating film SZ as gate insulating films and the first-level interconnect as a gate electrode. Low threshold voltage Vt of this MOS tends to facilitate the flow of an electric current below the field oxide film 4.

Figure 9:
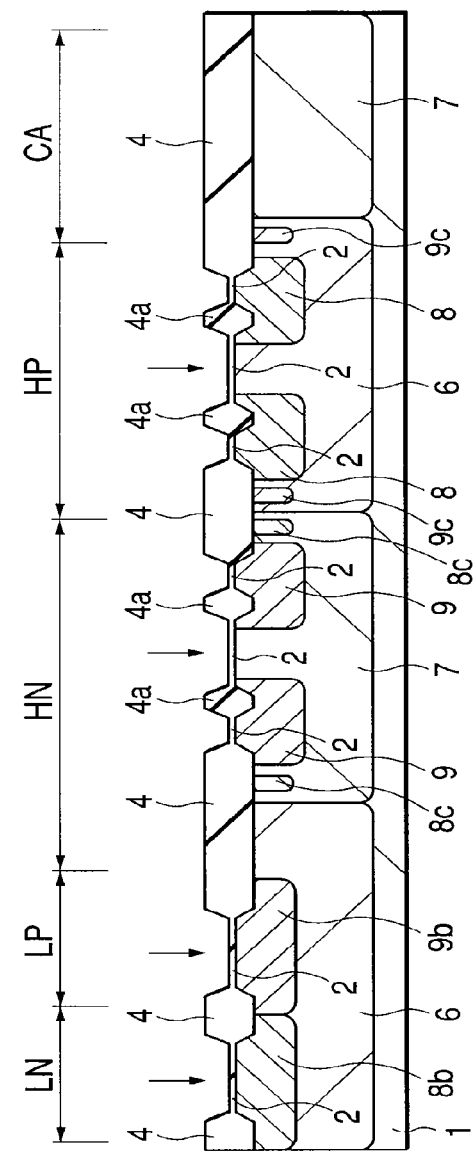
FIG. 9 is a fragmentary cross-sectional view of a substrate illustrating the manufacturing method of a semiconductor integrated circuit device according to Embodiment 1 of the present invention.
Figure 10:
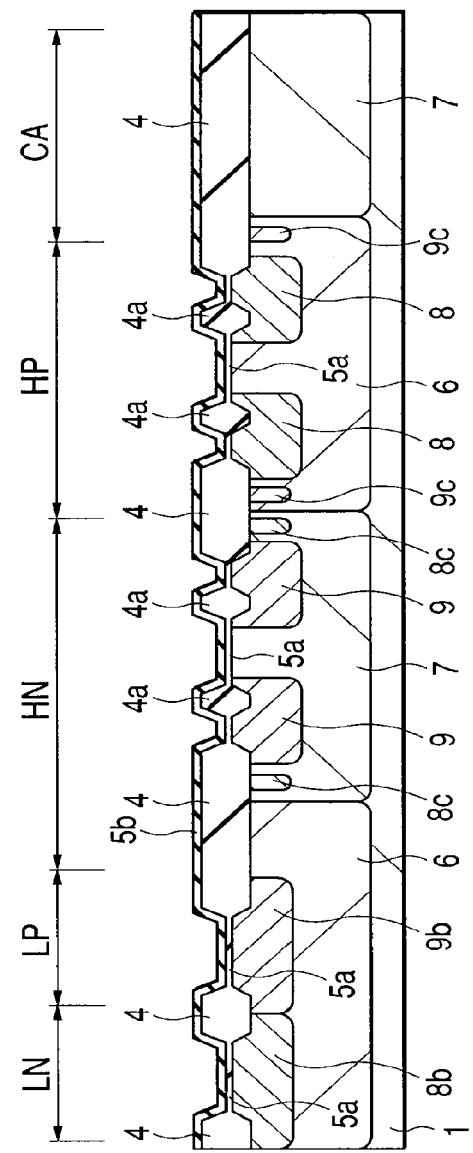
FIG. 10 is a fragmentary cross-sectional view of a substrate illustrating the manufacturing method of a semiconductor integrated circuit device according to Embodiment 1 of the present invention.

As illustrated in FIG. 8, a resist film R6 is formed over a region other than the low breakdown voltage n channel type MISFET forming region LN. With this resist film R6 as a mask, boron is ion-implanted, followed by heat treatment, whereby a p type well 8b is formed (FIG. 9). Upon this ion implantation, a p type well 8c may be formed by ion implantation of boron below the field oxide film 4 in the high breakdown voltage n channel type MISFET forming region HN. This p type well 8c is formed, similar to the n type well 9c, to raise the threshold voltage Vt of a parasitic MOS formed over the field oxide film 4.

As illustrated in FIG. 9, an impurity is ion-implanted over the semiconductor substrate 1. This impurity implantation is conducted to control the threshold voltage Vt of the high breakdown voltage MISFETQn2,Qp2. In FIG. 9, ion implantation is conducted all over the surface of the semiconductor substrate 1. Alternatively, the threshold voltage Vt of the high breakdown voltage MISFETQn2,Qp2 may be controlled by ion implantation of desired impurities to the high breakdown voltage n channel type MISFET forming region HN and high breakdown voltage p channel type MISFET forming region HP, respectively.

After removal of the thin oxide film 2 over the surface of the semiconductor substrate 1, a silicon oxide film 5a (second insulating film) which is to be a portion of a gate insulating film 5 is formed by thermal oxidation. Over the semiconductor substrate 1, a silicon oxide film 5b (third insulating film) is deposited by low pressure chemical vapor deposition (LPCVD). The thickness of this silicon oxide film 5b is set greater than that of the silicon oxide film 5a.

Figure 11A:
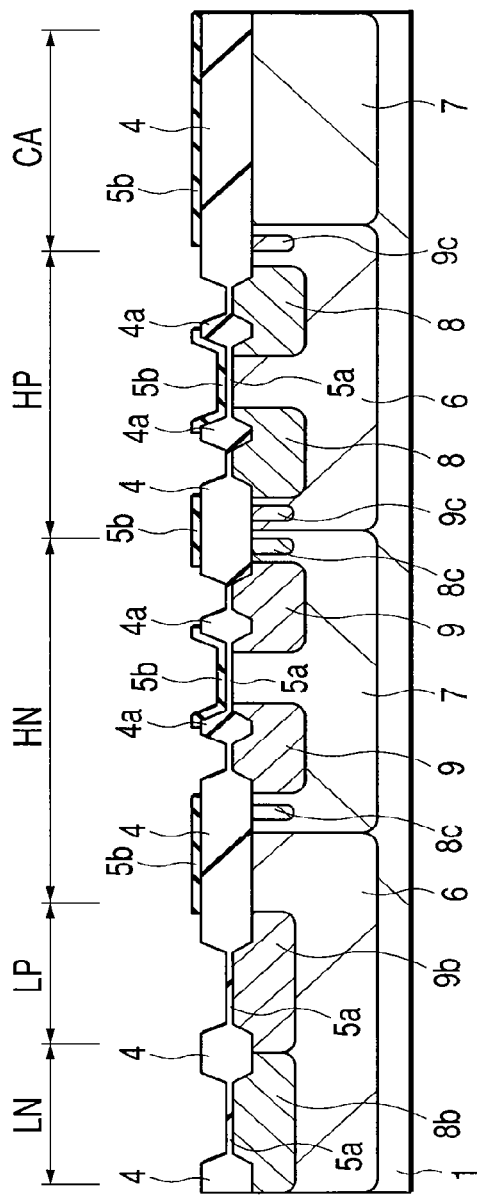
FIGS. 11(a) and 11(b) are fragmentary cross-sectional views of a substrate illustrating the manufacturing method of a semiconductor integrated circuit device according to Embodiment 1 of the present invention.

As illustrated in FIG. 11(a), the silicon oxide film 5b is patterned to leave the silicon oxide film 5b over the field oxide film 4 in future gate electrode regions of the high breakdown voltage MISFETQn2,Qp2, the high breakdown voltage n channel type MISFET forming region HN, the high breakdown voltage p channel type MISFET forming region HP and the capacitive element forming region CA. By this treatment, the silicon oxide film 5b is not left over the field oxide film 4 (except for the boundary between the high breakdown voltage region and the low breakdown voltage region, that is, in FIG. 11(a), a region of the field oxide film 4 on the boundary of the high breakdown voltage n channel type MISFET forming region HN and low breakdown voltage p channel type MISFET forming region LP) in the low breakdown voltage n channel type MISFET forming region LN and low breakdown voltage p channel type MISFET forming region LP. The silicon oxide film 5b is left over the field oxide film 4 in the capacitive element forming region CA so as to reduce a parasitic capacitance with the substrate (p type well 7).

As illustrated in FIG. 11, the field oxide films 4 in these regions (LN,LP) are formed to have a width not greater than 1 μm to attain high integration of elements (MISFETQn1, Qp1, etc.) formed at the low breakdown voltage region. It is therefore very difficult to carry out patterning so as to leave the silicon oxide film 5b over the field oxide film 4 having such a narrow width as formed at the low breakdown voltage region and mask misalignment tends to occur. When this mask misalignment occurs, there is a possibility of the silicon oxide film 5b extending over future source-drain regions of the MISFETQn1,Qp1 or a future gate electrode region, leading to a problem such as narrowing of the width of the source-drain regions of the MISFETQn1,Qp1 or gate electrode. To avoid such a problem, the silicon oxide film 5b over the field oxide film 4 in the low breakdown voltage region is removed.

Figure 11B:
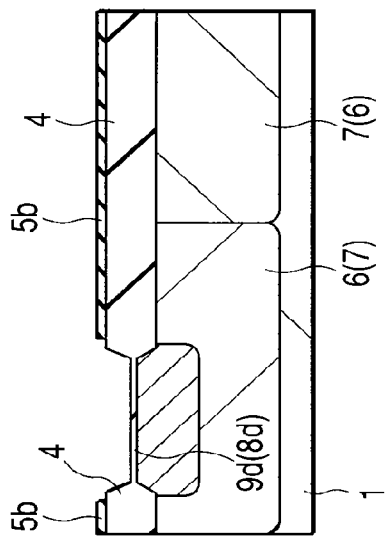

As illustrated in FIG. 11(b), the silicon oxide film 5b is also removed from the semiconductor region (fourth semiconductor region) over the semiconductor region 9d or 8d for feeding the n type isolation region 6 or p type well 7 with a power supply voltage or ground level voltage (fixed potential) (an opening portion as referred to in claims). This semiconductor region 9d or 8d has the same conductivity type as that of the n type isolation region 6 or p type well 7 wherein it is formed. At least one semiconductor region 9d or 8d is formed inside of the n type isolation region 6 or p type well 7 and to it, a power supply voltage or ground level voltage is applied.

Removal of the silicon oxide film 5b over the source-drain regions of the MISFETQn1,Qp1,Qp2,Qn2 makes it possible to carry out simultaneous ion implantation in these regions having the same conductivity type. This enables a reduction in the number of masks and also a step reduction.

Figure 12:
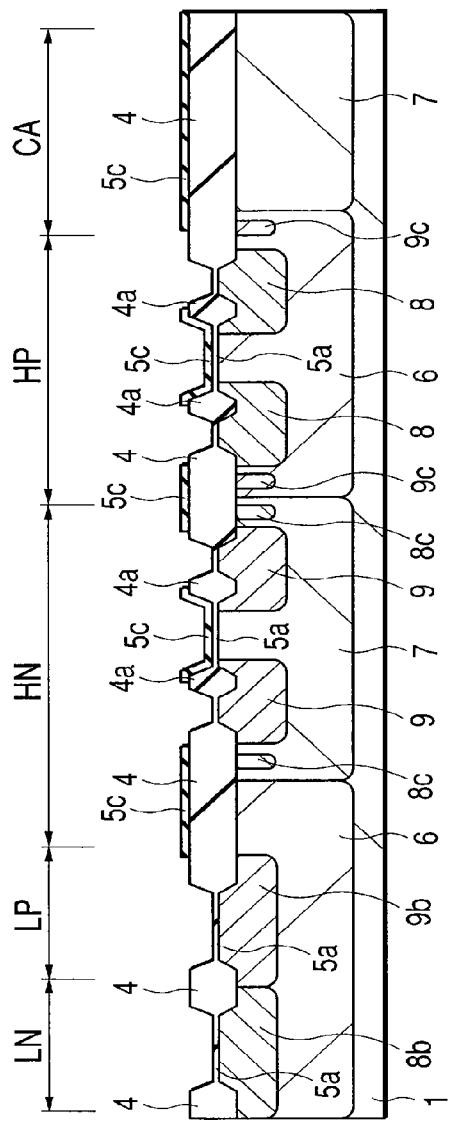
FIG. 12 is a fragmentary cross-sectional view of a substrate illustrating the manufacturing method of a semiconductor integrated circuit device according to Embodiment 1 of the present invention.

The quality of the silicon oxide film 5b is then improved by heat treatment at 900° C., desirably 1000° C. or greater. The silicon oxide film after heat treatment is called 5c (FIG. 12). The silicon oxide film 5c over the future gate electrode region of the high breakdown voltage MISFETQn2,Qp2 becomes a portion of the gate insulating film 5. In short, the gate insulating film of each of the high breakdown voltage MISFETQn2,Qp2 is constituted by this silicon oxide film 5c and silicon oxide film 5a. High temperature heat treatment imparts the silicon oxide film 5b with a similar quality to a thermally oxidized film. When the silicon oxide film 5b without heat treatment is used as a gate insulating film, trap levels are much incorporated in the silicon oxide film 5b, making it difficult to regulate the threshold voltage Vt.

Owing to the silicon oxide film 5c over the field oxide film 4 in the high breakdown voltage n channel type MISFET forming region HN, high breakdown voltage p channel type MISFET forming region HP and capacitive element forming region CA, the threshold voltage Vt of a parasitic MOS formed over these regions can be heightened.

Since the silicon oxide film 5b is formed by LPCVD, an etching ratio of it relative to the field oxide films 4,4a which are thermally oxidized films can be set high. The silicon oxide film 5b can therefore be etched without substantial etching of the surface of the field oxide films 4,4a, which makes it possible to maintain a sufficient thickness of the field oxide film 4 and to keep a large threshold voltage Vt of a parasitic MOS formed over the field oxide film 4.

Figure 13:
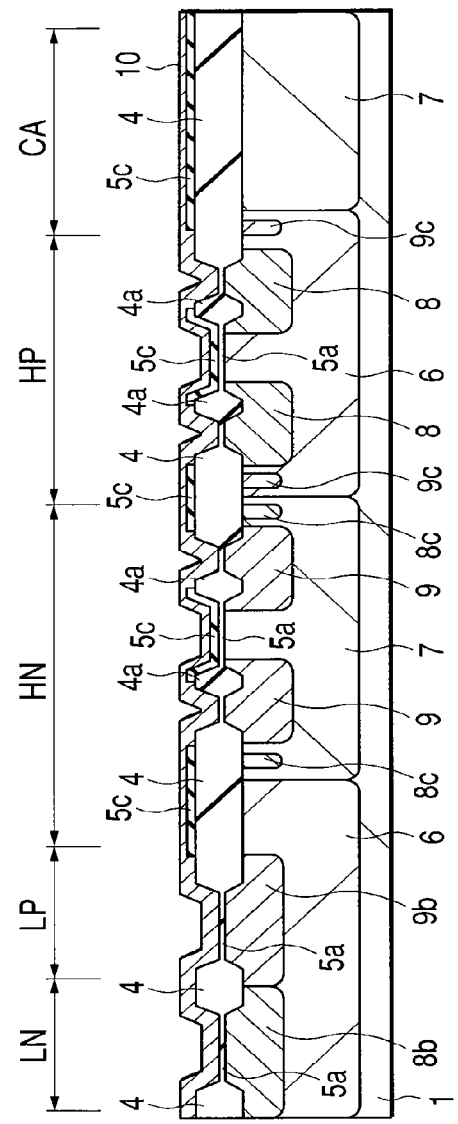
FIG. 13 is a fragmentary cross-sectional view of a substrate illustrating the manufacturing method of a semiconductor integrated circuit device according to Embodiment 1 of the present invention.

As illustrated in FIG. 13, a polycrystalline silicon film (polysilicon) 10 is deposited over the semiconductor substrate 1 by CVD. Phosphorus impurity may be incorporated in the polycrystalline silicon film 10 by reacting polycrystalline silicon in a phosphorus-containing atmosphere. Alternatively, phosphorus may be doped after formation of the polycrystalline silicon film 10.

Figure 14A:
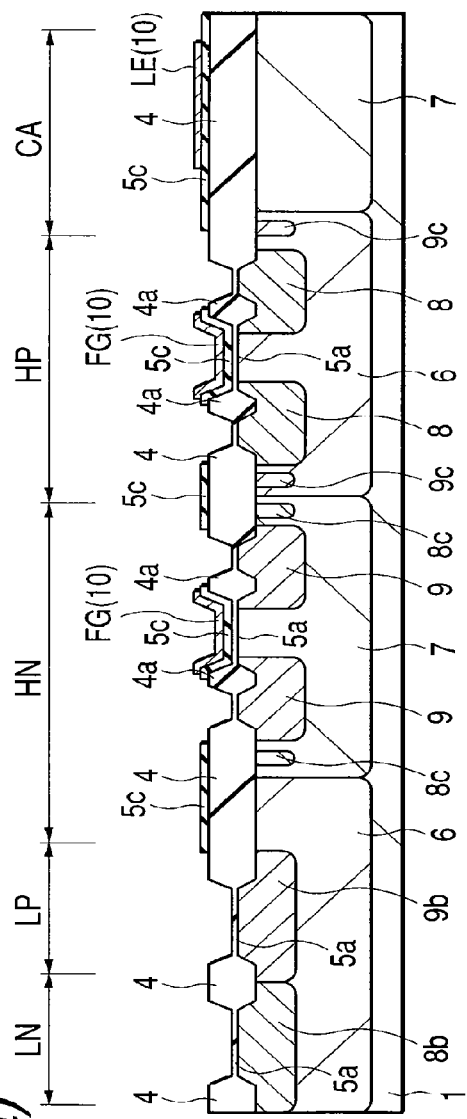
FIGS. 14(a) and 14(b) are fragmentary cross-sectional views of a substrate illustrating the manufacturing method of a semiconductor integrated circuit device according to Embodiment 1 of the present invention.
Figure 14B:
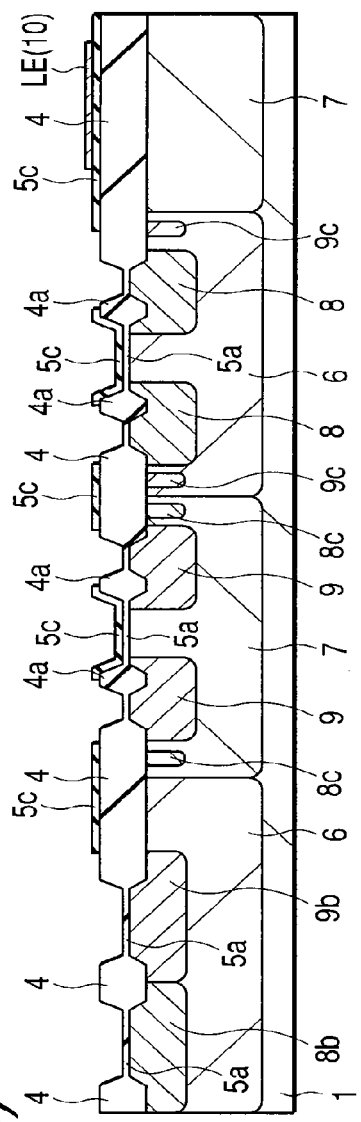

As illustrated in FIG. 14(a), the polycrystalline silicon film 10 is then patterned to leave it on the gate insulating film 5 (5a,5c) of the high breakdown voltage MISFETQn2,Qp2. This polycrystalline silicon film 10 is to be a gate electrode FG (first conductive film) of the high breakdown voltage MISFETQn2,Qp2. At this time, the polycrystalline silicon film 10 is left also on the silicon oxide film 5c of the capacitive element forming region CA (third region). This polycrystalline silicon film 10 is to be a lower electrode LE of the capacitive element C. Here, the gate electrode of each of the high breakdown voltage MISFETQn2,Qp2 is formed from the polycrystalline silicon film 10 (FG), but as will be described later, the gate electrode of each of the high breakdown voltage MISFETQn2,Qp2 may be formed from a polycrystalline silicon film 11 (SG) which will be described later. FIG. 14(b) and FIG. 16(b) illustrate the case wherein the gate electrodes of the high breakdown voltage MISFETQn2,Qp2 are formed from the polycrystalline silicon film 11.

Figure 15:
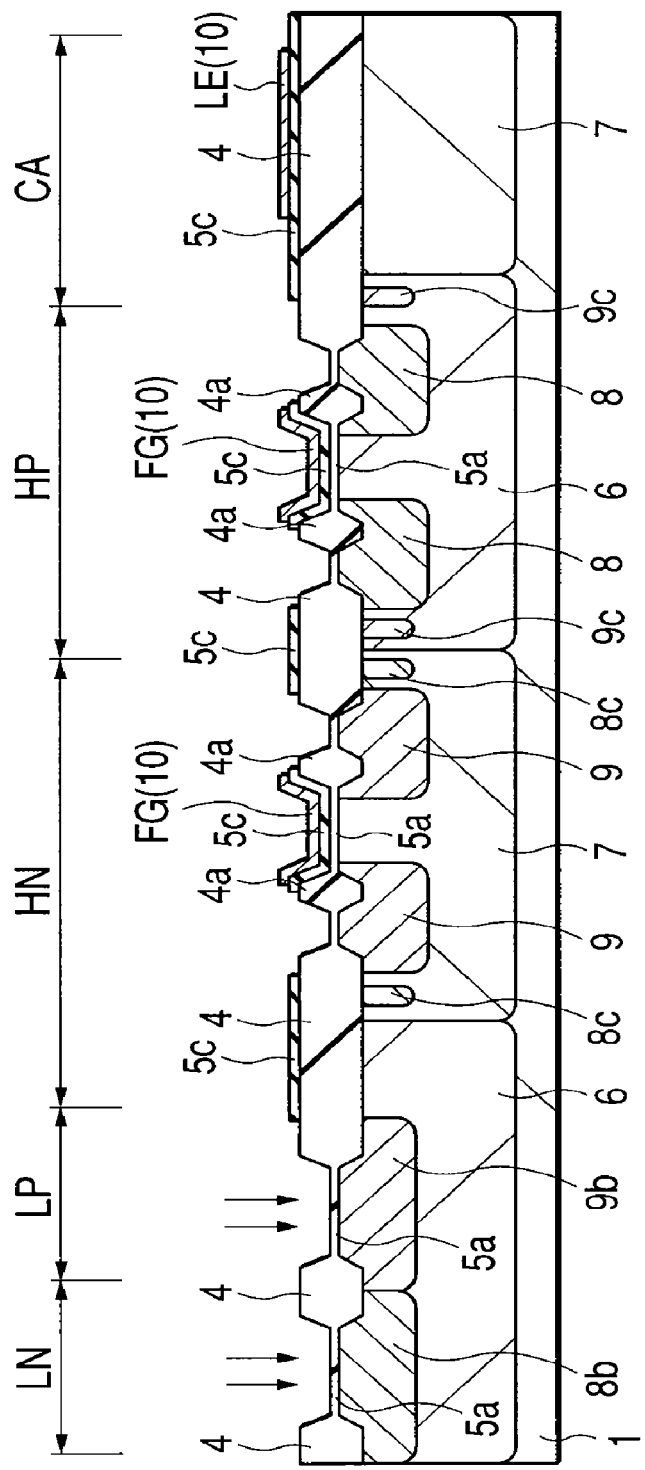
FIG. 15 is a fragmentary cross-sectional view of a substrate illustrating the manufacturing method of a semiconductor integrated circuit device according to Embodiment 1 of the present invention.

As illustrated in FIG. 15, an impurity is ion-implanted on the semiconductor substrate 1. This implantation is conducted to regulate the threshold voltage Vt of the low breakdown voltage MISFETQn1,Qp1. The regulation of the threshold voltage Vt of the low breakdown voltage MISFETQn1,Qp1 may be carried out by ion-implantation of desired impurities to the low breakdown voltage n channel type MISFET forming region LN and low breakdown voltage p channel type MISFET forming region LP, respectively.

Figure 16A:
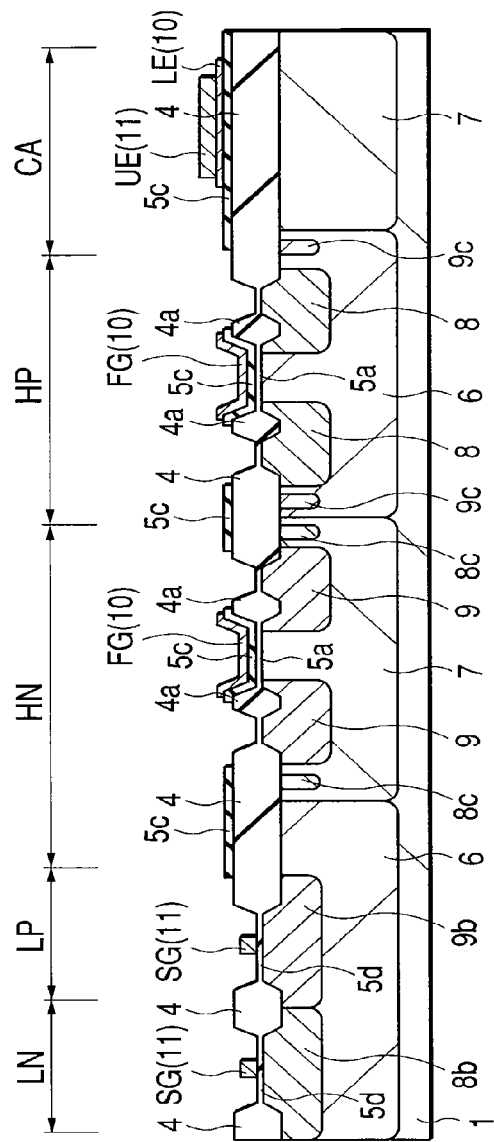
FIGS. 16(a) and 16(b) are fragmentary cross-sectional views of a substrate illustrating the manufacturing method of a semiconductor integrated circuit device according to Embodiment 1 of the present invention.
Figure 16B:
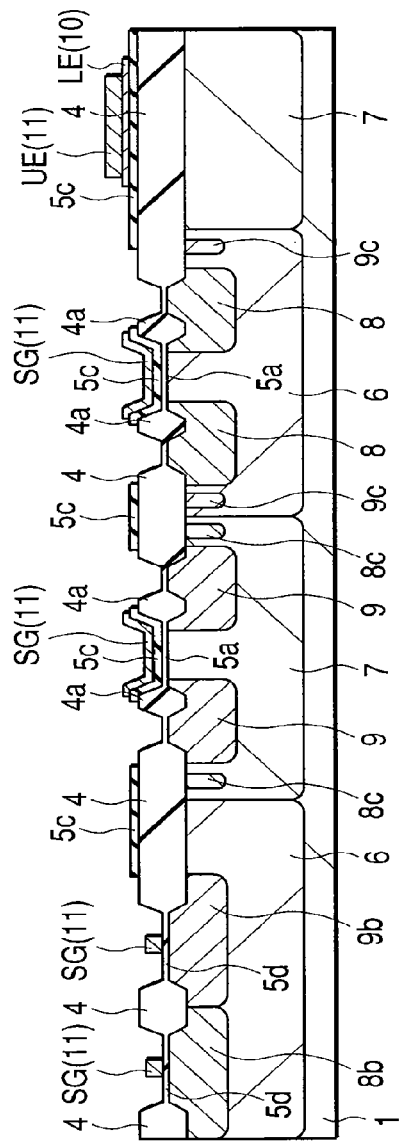

As illustrated in FIG. 16(a), after removal of the thin silicon oxide film 5a over the low breakdown voltage n channel type MISFET forming region LN and low breakdown voltage p channel type MISFET forming region LP, a silicon oxide film to be a gate insulating film 5d (fourth insulating film) of the low breakdown voltage MISFETQn1,Qp1 is formed by thermal oxidation. At this time, the gate electrode FG of each of the high breakdown voltage MISFETQn2,Qp2 is slightly oxidized. The surface of the lower electrode LE is also slightly oxidized and a silicon oxide film (not illustrated) is formed thereover. This silicon oxide film serves as a capacitive insulating film. Alternatively, after deposition of the polycrystalline silicon film 10 which will be the lower electrode LE, a silicon nitride film may be formed in advance over this polycrystalline silicon film 10 as a capacitive insulating film in order to improve reliability of the capacitive element C.

In the above-described steps, removal of a thin oxide film on the surface of the semiconductor substrate such as removal of the silicon oxide film 2 or silicon oxide film 5a is carried out in repetition. Upon this removal of the silicon oxide film, the surface of the field oxide film 4 is inevitably etched and its thickness decreases. According to this Embodiment, however, the decreased film thickness can be made up for by the silicon oxide film 5c over the field oxide film 4, which makes it possible to maintain high threshold voltage Vt of a parasitic MOS formed thereover and to suppress parasitic generation below the field oxide film due to the interconnection between elements. It is needless to say that the threshold voltage Vt of a parasitic MOS must be higher than the voltage to be applied to the element. The voltage to be applied to the MISFETQn1, Qp1 of the low breakdown voltage region is, for example, about 3.6V, while the voltage to be applied to the MISFETQn2,Qp2 of the high breakdown voltage region is, for example, about 20V. Adjustment of the thickness of the silicon oxide film 5c to exceed that of the silicon oxide film 2 or 5d is more effective.

Over the semiconductor substrate 1, a polycrystalline silicon film 11 is then deposited by CVD. This polycrystalline silicon film 11 is patterned to leave it over the gate insulating film 5d of the low breakdown voltage MISFETQn1,Qp1. This polycrystalline silicon film 11 is to be a gate electrode SG (second conductive film) of the low breakdown voltage MISFETQn1,Qp1. At this time, the polycrystalline silicon film 11 is left also over the capacitive insulating film (not illustrated) over the lower electrode LE of the capacitive element forming region CA. This polycrystalline silicon film 11 is to be an upper electrode UE of the capacitive element C. Alternatively, the gate electrode SG may be formed by patterning a tungsten silicide layer formed over the surface of the polycrystalline silicon film 11. This tungsten silicide layer is formed by depositing a metal film such as tungsten film over the polycrystalline silicon film 11, followed by heat treatment. This silicide layer is formed to lower the resistance of the gate electrode SG.

Next, source-drain regions of the low breakdown voltage MISFETQn1,Qp1 and high breakdown voltage MISFETQn2,Qp2 are formed. A description will be made of the formation of these source-drain regions.

Figure 17:
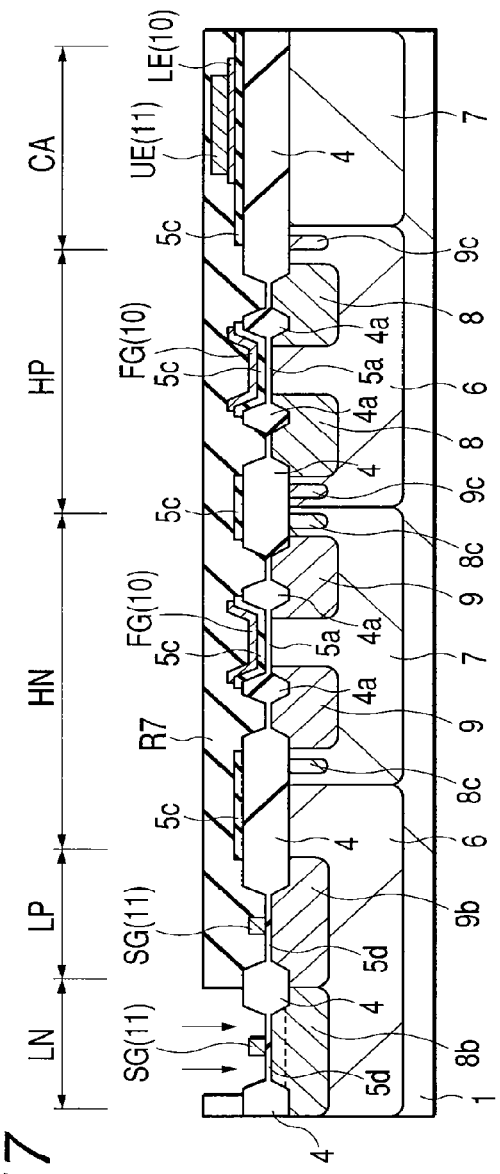
FIG. 17 is a fragmentary cross-sectional view of a substrate illustrating the manufacturing method of a semiconductor integrated circuit device according to Embodiment 1 of the present invention.

As illustrated in FIG. 17, a resist film R7 is formed over the semiconductor substrate 1, followed by opening a hole on the low breakdown voltage n channel type MISFET forming region LN. With this resist film R7 and the gate electrode SG of the low breakdown voltage MISFETQn1 as masks, phosphorus is ion-implanted.

Figure 18:
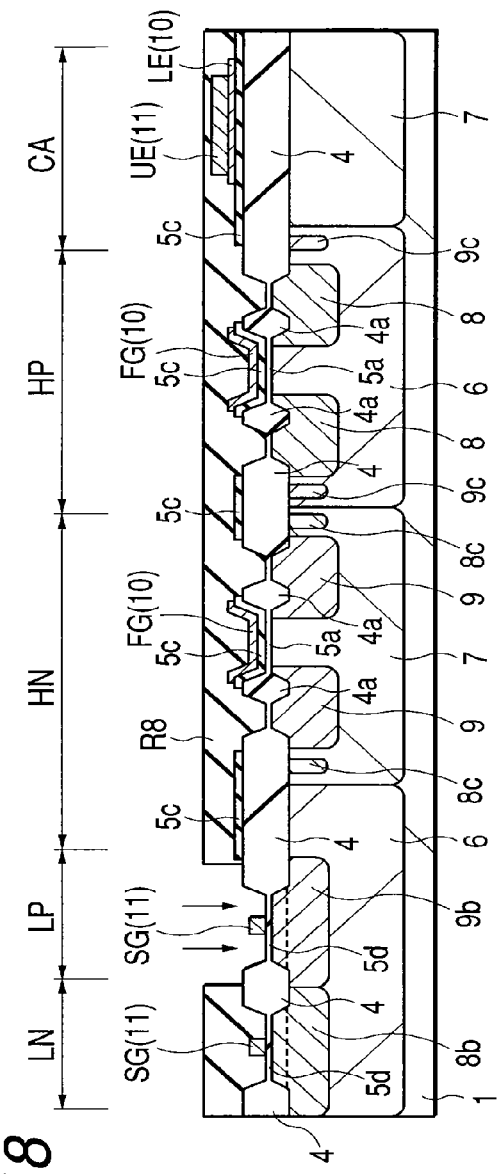
FIG. 18 is a fragmentary cross-sectional view of a substrate illustrating the manufacturing method of a semiconductor integrated circuit device according to Embodiment 1 of the present invention.

After removal of the resist film R7, a resist film R8 is formed over the semiconductor substrate 1 as illustrated in FIG. 18, followed by opening of a hole on the low breakdown voltage p channel type MISFET forming region LP. With this resist film R8 and the gate electrode SG of the low breakdown voltage MISFETQp1 as masks, boron is ion-implanted.

Figure 19:
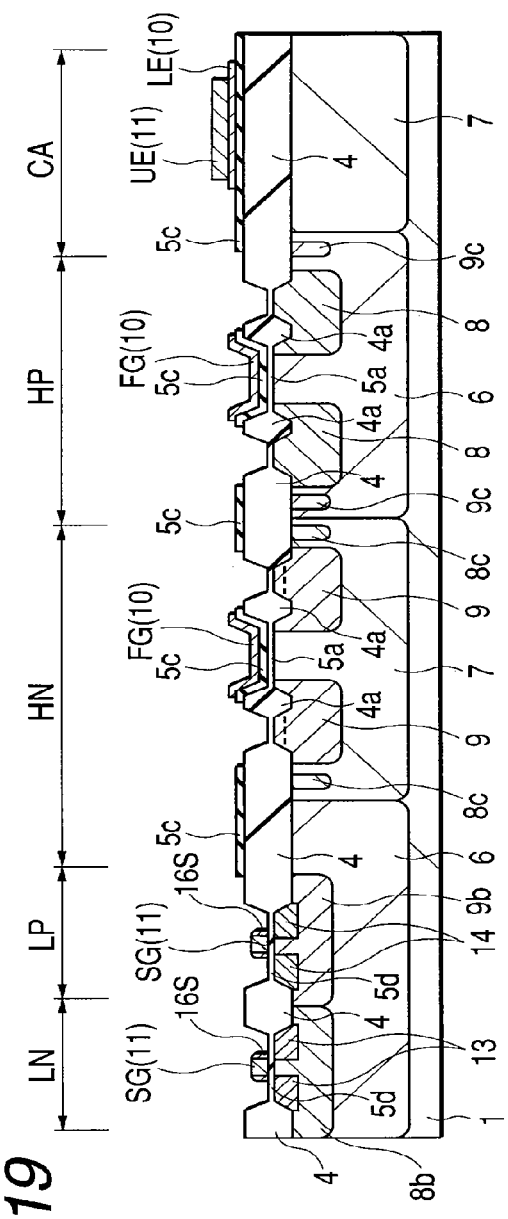
FIG. 19 is a fragmentary cross-sectional view of a substrate illustrating the manufacturing method of a semiconductor integrated circuit device according to Embodiment 1 of the present invention.

After removal of the resist film R8, phosphorus and boron thus implanted are thermally diffused on both sides of the low breakdown voltage MISFETQn1 and Qp1, respectively, whereby p⁻ type semiconductor regions 14 and n⁻ type semiconductor regions 13 are formed (FIG. 19).

As illustrated in FIG. 19, after deposition of a silicon oxide film over the semiconductor substrate 1, the film is etched back, whereby a side wall film 16s is formed over the side walls of the gate electrode SG of each of the low breakdown voltage MISFETQn1,Qp1.

Figure 20:
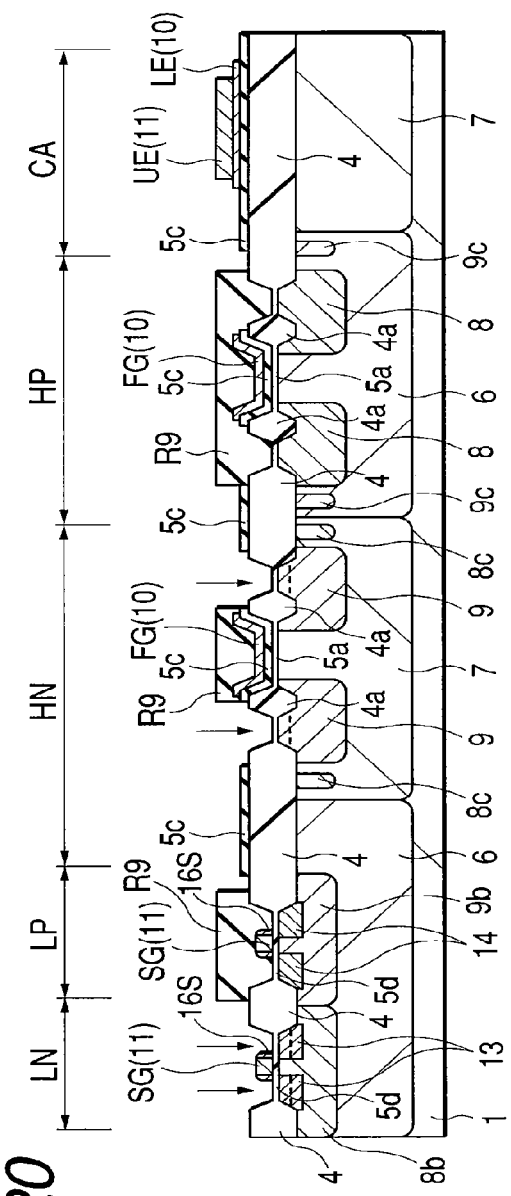
FIG. 20 is a fragmentary cross-sectional view of a substrate illustrating the manufacturing method of a semiconductor integrated circuit device according to Embodiment 1 of the present invention.

As illustrated in FIG. 20, a resist film R9 is formed over gate electrode SG of the low breakdown voltage p channel type MISFET forming region LP and the gate electrode FG of each of the high breakdown voltage p channel type MISFET forming region HP and high breakdown voltage MISFETQn2. With this resist film R9 as a mask, arsenic (As) is ion-implanted, followed by annealing and activation, whereby n⁺ type semiconductor regions 17 (source-drain regions) are formed on both sides of each of the gate electrodes (SG,FG) of the low breakdown voltage MISFETQn1 and high breakdown voltage MISFETQn2 (FIG. 21).

Figure 21:
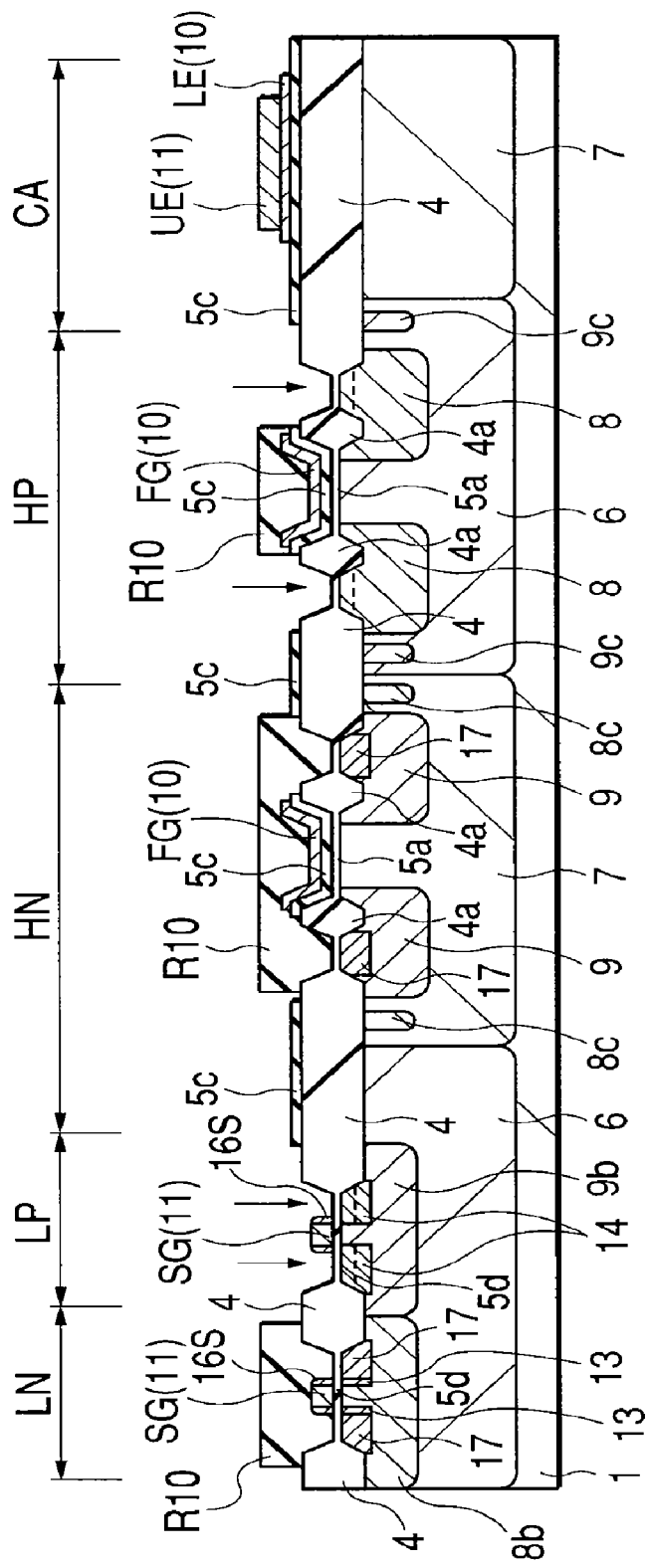
FIG. 21 is a fragmentary cross-sectional view of a substrate illustrating the manufacturing method of a semiconductor integrated circuit device according to Embodiment 1 of the present invention.

As illustrated in FIG. 21, a resist film R10 is then formed over the low breakdown voltage n channel type MISFET forming region LN, and the gate electrode FG of each of the high breakdown voltage n channel type MISFET forming region HN and high breakdown voltage p channel type MISFETQp2. With this resist film R10 as a mask, boron is ion-implanted, followed by annealing and activation, whereby p⁺ type semiconductor regions 18 (source-drain regions) are formed on both sides of each of the gate electrodes (SG,FG) of the low breakdown voltage p channel type MISFETQp1 and high breakdown voltage p channel type MISFETQp2 (FIG. 22(a)). At this time, boron is not implanted below the field oxide films 4,4a and silicon oxide film 5c.

Here, the resist films R7,R8 are left over the gate electrode FG of each of the high breakdown voltage MISFETQn2,Qp2 in order to prevent charging of the gate electrode FG and occurrence of dielectric breakdown of the gate oxide film due to ion implantation.

By the so far described steps, the low breakdown voltage MISFETQn1,Qp1 (first MISFETs) equipped with source-drain (n⁻ type semiconductor regions 13 and n⁺ type semiconductor regions 17, p⁻ type semiconductor regions 14 and p⁺ type semiconductor regions 18) having an LDD (Lightly Doped Drain) structure are formed in the low breakdown voltage regions (LN,LP (first regions)), while the high breakdown voltage MISFETQn2,Qp2 (second MISFETs) are formed in the high breakdown voltage regions (HN,HP (second regions)).

Over these Qn1, Qn2, Qp1 and Qp2, and capacitive element C, an interlevel insulating film SZ made of a silicon oxide film or the like is deposited. After formation of a contact hole (not illustrated) over a desired region, a first-level interconnect M1 is formed over the interlevel insulating film including the contact hole (refer to FIG. 22(b)). A multilayer interconnect may be formed by repeating formation of an interlevel insulating film and a wiring metal over the first-level interconnect M1. Over the uppermost interconnect, a protective film is formed to cover the whole chip, but its diagram and detailed description are omitted.

In this Embodiment, the gate electrode SG of each of the low breakdown voltage MISFETQn1,Qp1 was formed by the polycrystalline silicon film 11, while the gate electrode FG of each of the high breakdown voltage MISFETQn2,Qp2 was formed by the polycrystalline silicon film 10. Alternatively, these gate electrodes may be formed from the polycrystalline silicon film 11.

Described specifically, as illustrated in FIG. 14(b), after deposition (refer to FIG. 13) of the polycrystalline silicon film 10 of this Embodiment, the polycrystalline silicon film 10 is left only over the silicon oxide film 5c in the capacitive element forming region CA and by using it, the lower electrode LE is formed.

An impurity is then ion-implanted over the semiconductor substrate 1 in order to regulate the threshold voltage Vt of the low breakdown voltage MISFETQn1,Qp1 (refer to FIG. 15). As illustrated in FIG. 16(b), the thin oxide film 5a over the low breakdown voltage n channel type MISFET forming region LN and low breakdown voltage p channel type MISFET forming region LP is removed, followed by formation of a silicon oxide film to be a gate insulating film 5d of each of the low breakdown voltage MISFETQn1,Qp1 by thermal oxidation.

Over the semiconductor substrate 1, the polycrystalline silicon film 11 is deposited by CVD. This polycrystalline silicon film 11 is then patterned to leave it over the gate insulating film 5 (5a,5c) of the high breakdown voltage MISFETQn2,Qp2 and the gate insulating film 5d of the low breakdown voltage MISFETQn1,Qp1.

By these steps, the gate electrode of each of the low breakdown voltage MISFETQn1,Qp1 and high breakdown voltage MISFETQn2,Qp2 can be formed simultaneously from the polycrystalline silicon film 11 (SG). The gate electrode of each of the low breakdown voltage MISFETQn1,Qp1 and high breakdown voltage MISFETQn2,Qp2 may also be formed from the polycrystalline silicon film 10, but if so, the polycrystalline silicon film 11 inevitably remains over the side walls of the gate electrode in the subsequent deposition and patterning steps of the polycrystalline silicon film 11, which adversely affects the characteristics of MISFET. It is therefore preferred to form these gate electrodes from the polycrystalline silicon film 11.

Embodiment 2

In Embodiment 1, the field oxide film 4 was used for separation between two adjacent regions of LN, LP, HN, and HP of the MISFET forming regions. Instead of it, an oxide film embedded in a groove may be used for separation.

A manufacturing method of a semiconductor integrated circuit device according to this Embodiment will next be described in the order of steps based on FIGS. 23 to 33.

Figure 23:
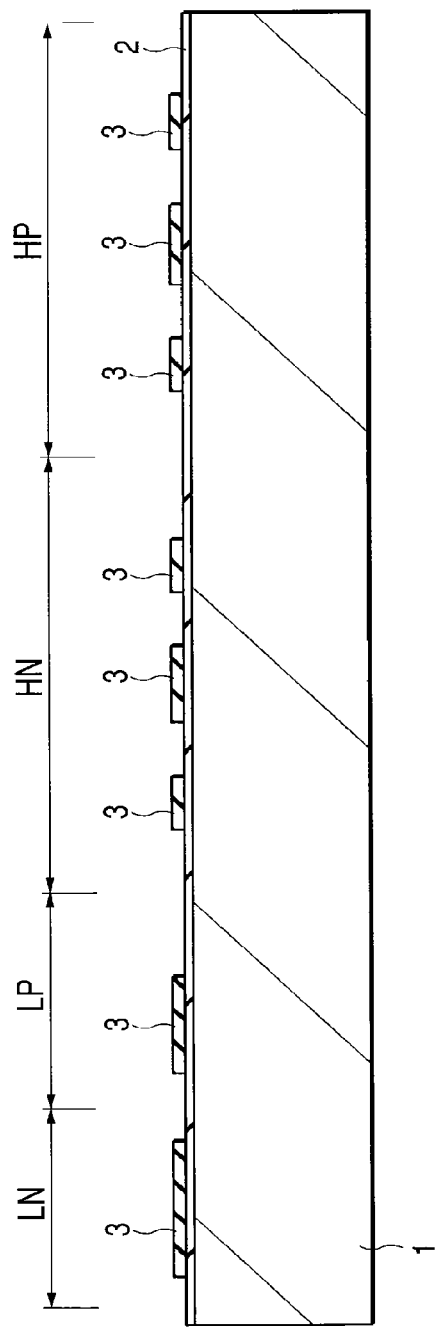
FIG. 23 is a fragmentary cross-sectional view of a substrate illustrating a manufacturing method of a semiconductor integrated circuit device according to Embodiment 2 of the present invention.

As illustrated in FIG. 23, a semiconductor substrate 1 made of p type single crystal silicon is prepared. This semiconductor substrate 1 has a region LN wherein a low breakdown voltage n channel type MISFETQn1 is to be formed, a region LP wherein a low breakdown voltage p channel type MISFETQp1 is to be formed, a region HN wherein a high breakdown voltage n channel type MISFETQn2 is to be formed, and a region HP wherein a high breakdown voltage p channel type MISFETQp2 is to be formed.

Figure 24:
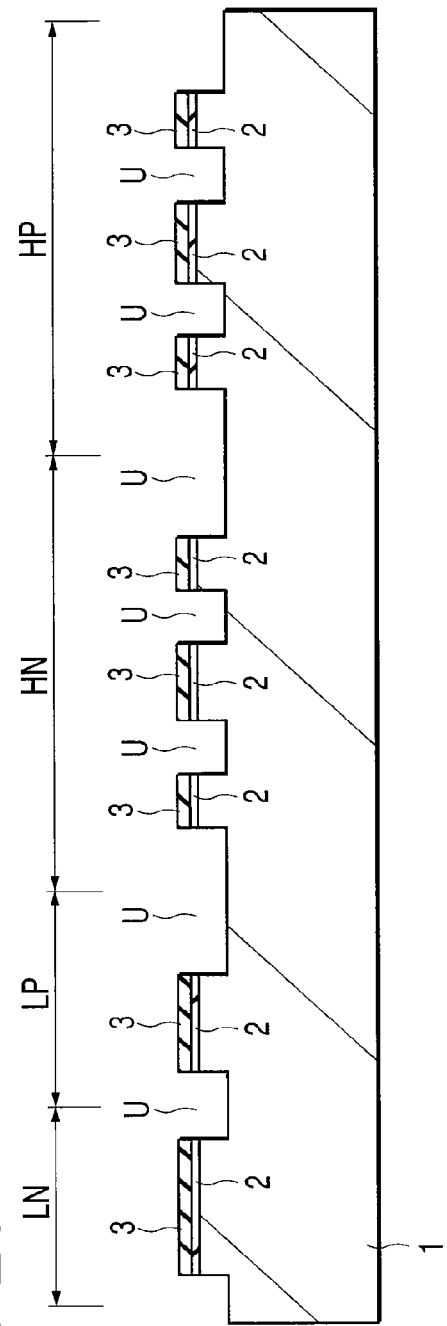
FIG. 24 is a fragmentary cross-sectional view of the substrate illustrating the manufacturing method of a semiconductor integrated circuit device according to Embodiment 2 of the present invention.

By oxidizing the surface of this semiconductor substrate 1, a silicon oxide film 2 is formed. After selective formation of a silicon nitride film 3 over this silicon oxide film, with this silicon nitride film 3 as a mask, the semiconductor substrate 1 is etched to form grooves U of about 300 nm depth as illustrated in FIG. 24. In the high breakdown voltage MISFETQn2,Qp2 forming regions (HN,HP), a groove is formed below both ends of a gate electrode which will be described later.

The substrate 1 is thermally oxidized at about 1000° C. to form a thin silicon oxide film (not illustrated) of about 10 nm thick on the inside wall of the groove. This silicon oxide film serves to recover the damage on the inside wall of the groove formed by dry etching and in addition, to relax a stress appearing on the interface between the substrate 1 and a silicon oxide film 104 to be embedded inside of the groove in the subsequent step.

Figure 25:
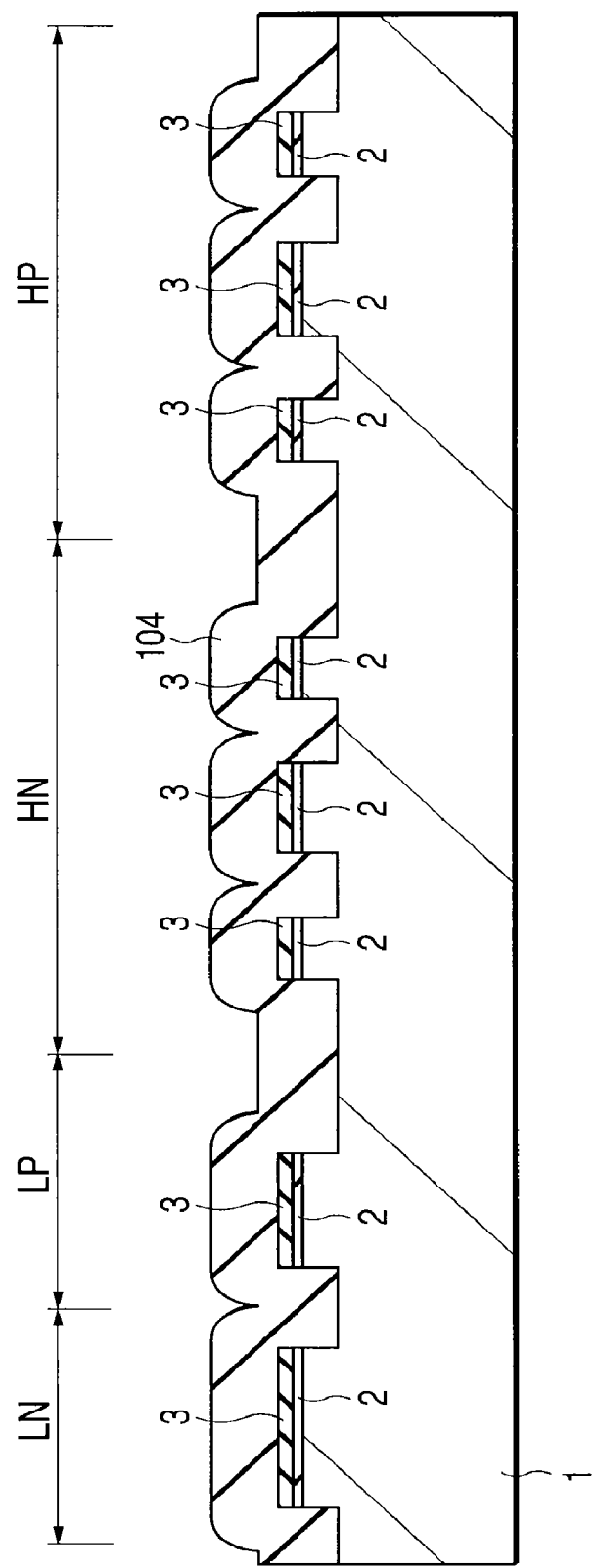
FIG. 25 is a fragmentary cross-sectional view of a substrate illustrating the manufacturing method of a semiconductor integrated circuit device according to Embodiment 2 of the present invention.

As illustrated in FIG. 25, the silicon oxide film 104 is deposited over the substrate 1 including the inside of the groove by CVD. With the silicon nitride film 3 as a stopper, the silicon oxide film 104 over the groove is chemically and mechanically polished to planarize its surface. By removal of the silicon nitride film 3, the silicon oxide film 104 for element isolation and the silicon oxide film 104a for improving the breakdown voltage of the high breakdown voltage MISFETQn2,Qp2 are completed (FIG. 26(a)).

Here, as illustrated in FIG. 26(b), a recess phenomenon of the surface of each of the silicon oxide films 104,104a at the end portion of the groove occurs owing to the above-described polishing, washing of the surface of the semiconductor substrate in a subsequent impurity implantation step or removal of the thin oxide film 2 prior to the formation of the silicon oxide film 5a. This recess phenomenon leads to various problems such as deterioration in the breakdown voltage of MISFET and occurrence of kink phenomenon as will be described below in detail. In the drawings, recess of the surface of the silicon oxide films 104,104a is not illustrated in order to simplify them.

With regard to steps similar to those of Embodiment 1 among the subsequent steps, overlapping description is avoided and only the outline is described.

As illustrated in FIG. 27, boron is ion-implanted below the silicon oxide films 104,104a in the high breakdown voltage n channel type MISFET forming region HN, whereby a p type well 6 is formed.

Phosphorus is ion-implanted below the silicon oxide films 104,104a in the high breakdown voltage p channel type MISFET forming region HP, whereby an n type well 7 is formed.

Implanting energy of ions (phosphorus, boron) at this time is set so that ions are implanted also below the silicon oxide films 104,104a in the high breakdown voltage n channel type MISFET forming region HN and high breakdown voltage p channel type MISFET forming region HP.

As illustrated in FIG. 28, boron is ion-implanted in the vicinity of the source-drain regions of the high breakdown voltage p channel type MISFETQp2 to form a p type electric field relaxation layer 8, while phosphorus is ion-implanted in the vicinity of the source-drain regions of the high breakdown voltage n channel type MISFETQn2 to form an n type electric field relaxation layer 9. Implanting energy of ions (phosphorus, boron) at this time is set so that ions are also implanted below the silicon oxide films 104,104a.

As illustrated in FIG. 29, after removal of the thin silicon oxide film 2 on the surface of the semiconductor substrate 1, a silicon oxide film 5a to be a portion of a gate insulating film 5 is formed by thermal oxidation. A silicon oxide film 5b is then deposited over the semiconductor substrate 1 by low pressure chemical vapor deposition. This silicon oxide film 5b is then patterned to leave it over the silicon oxide film 104 in a future gate electrode region of the high breakdown voltage MISFETQn2,Qp2, the high breakdown voltage n channel type MISFET forming region HN and high breakdown voltage p channel type MISFET forming region HP. The silicon oxide film 5b is not left over the silicon oxide film 104 (except for the boundary between the high breakdown voltage region and the low breakdown voltage region, that is, in this diagram, the field oxide film on the boundary of the high breakdown voltage n channel type MISFET forming region HN and low breakdown voltage p channel type MISFET forming region LP) in the low breakdown voltage n channel type MISFET forming region LN and low breakdown voltage p channel type MISFET forming region LP. Since the silicon oxide films 104 over these regions are narrow as described in Embodiment 1, such a structure is adopted in order to prevent narrowing of the width of each of the source-drain regions or gate electrode of MISFETQn1,Qn2 due to mask misalignment.

By heat treatment at 900° C. or greater, quality of the silicon oxide film 5b is improved. The silicon oxide film after this heat treatment is called "5c". The silicon oxide film 5c over a future gate electrode region of the high breakdown voltage MISFETQn2,Qp2 becomes a portion of the gate insulating film 5. In short, this silicon oxide film 5c and silicon oxide film 5a constitute the gate insulating film 5 of the high breakdown voltage MISFETQn2,Qp2.

By this silicon oxide film 5c over the silicon oxide film 104 in the high breakdown voltage n channel type MISFET forming region HN and high breakdown voltage p channel type MISFET forming region HP, the threshold voltage Vt of a parasitic MOS formed over these regions can be increased.

Since the silicon oxide film 5b is formed by LPCVD, an etching ratio of this film relative to the silicon oxide films 104,104a can be set larger, making it possible to etch the silicon oxide film 5b without substantial etching of the surface of the silicon oxide films 104,104a. As a result, the thickness of the silicon oxide film 104 can be secured, whereby the threshold voltage Vt of a parasitic MOS formed thereover can be made greater. In addition, a recess amount of the surface of the silicon oxide films 104,104a due to the recess phenomenon as described above can be reduced.

As illustrated in FIG. 30, a polycrystalline silicon film 10 is deposited the semiconductor substrate 1 by CVD. This polycrystalline silicon film 10 may contain an impurity such as phosphorus. The polycrystalline silicon film 10 is then patterned to leave it over the gate insulating film 5 (5a,5c) of each of the high breakdown voltage MISFETQn2,Qp2. This polycrystalline silicon film 10 becomes a gate electrode FG of each of the high breakdown voltage MISFETQn2,Qp2.

Figure 31:
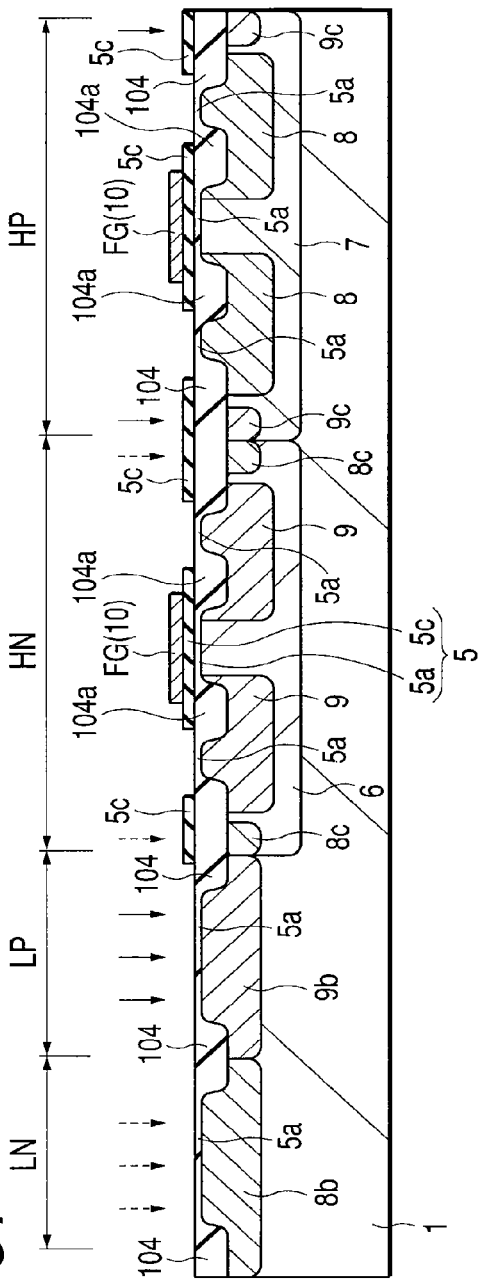
FIG. 31 is a fragmentary cross-sectional view of a substrate illustrating the manufacturing method of a semiconductor integrated circuit device according to Embodiment 2 of the present invention.

As illustrated in FIG. 31, boron is ion-implanted in the low breakdown voltage n channel type MISFET forming region LN to form a p type well 8b. At this ion implantation, a p type well 8c may be formed by implanting boron also below the silicon oxide film 104 in the high breakdown voltage n channel type MISFET forming region HN. In addition, phosphorus is ion-implanted in the low breakdown voltage p channel type MISFET forming region LP to form an n type well 9b. At this ion implantation, an n type well 9c may be formed by implanting phosphorus also below the silicon oxide film 104 in the high breakdown voltage p channel type MISFET forming region HP. These p type well 8c and n type well 9c are formed to increase the threshold voltage Vt of a parasitic MOS formed over the silicon oxide film 104.

Figure 32:
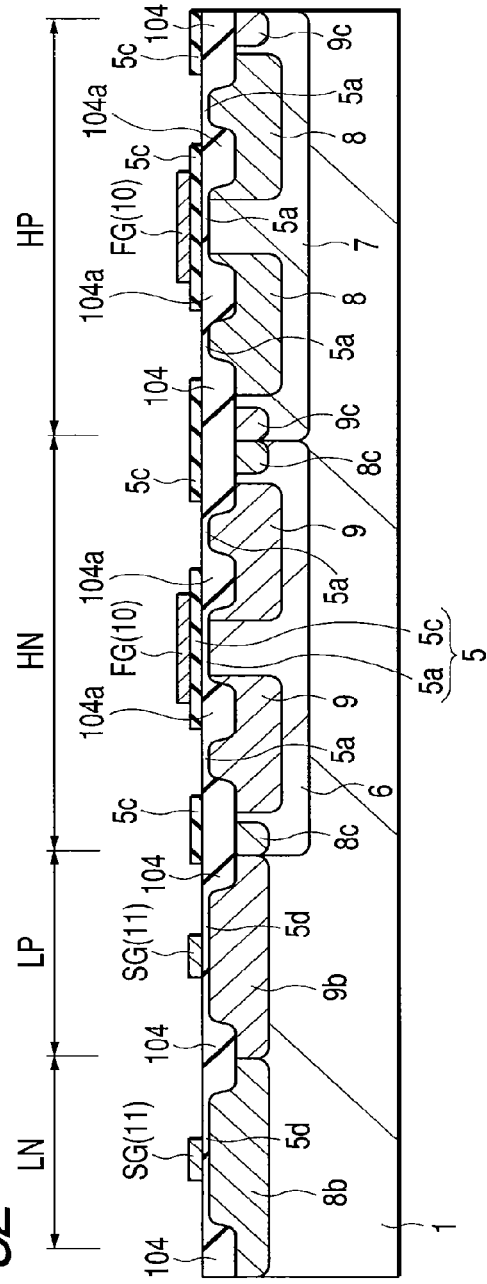
FIG. 32 is a fragmentary cross-sectional view of a substrate illustrating the manufacturing method of a semiconductor integrated circuit device according to Embodiment 2 of the present invention.

As illustrated in FIG. 32, after removal of the thin silicon oxide film 5a over the low breakdown voltage n channel type MISFET forming region LN and low breakdown voltage p channel type MISFET forming region LP, a gate insulating film 5d of each of the low breakdown voltage MISFETQn1, Qp1 is formed by thermal oxidation.

By CVD, a polycrystalline silicon film 11 is deposited over the semiconductor substrate 1. This polycrystalline silicon film 11 is patterned to leave it over the gate insulating film 5d of each of the low breakdown voltage MISFETQn1,Qp1. The polycrystalline silicon film 11 becomes a gate electrode SG of each of the low breakdown voltage MISFETQn1,Qp1. Alternatively, the gate SG may be formed by forming a tungsten silicide layer on the surface of the polycrystalline silicon film 11 and then patterning it. This silicide layer serves to decrease the resistance of the gate electrode SG.

As illustrated in FIG. 33(a), phosphorus is implanted on both sides of the gate electrode SG of the low breakdown voltage MISFETQn1 to form n⁻ type semiconductor regions 13, while boron is implanted on both sides of the gate electrode SG of the low breakdown voltage MISFETQp1 to form p⁻ type semiconductor regions 14.

After formation of a silicon oxide film 15 over the gate electrodes FG and SG, another silicon oxide film is deposited over the semiconductor substrate 1, followed by etching it back to form side wall films 16s on the side walls of a laminate of the silicon oxide film 15 with the gate electrode FG and that with SG.

On both sides of the gate electrodes (SG,FG) of the low breakdown voltage n-channel type MISFETQn1 and high breakdown voltage n-channel type MISFETQn2, arsenic is ion-implanted, whereby n⁺ type semiconductor regions 17 are formed. By implantation of boron, p⁺ type semiconductor regions 18 are formed on both sides of the gate electrodes (SG,FG) of the low breakdown voltage p-channel type MISFETQp1 and high breakdown voltage p-channel type MISFETQp2. At this time, neither arsenic nor boron is implanted below the silicon oxide films 104,104a and silicon oxide film 5c.

By the steps so far described, the low breakdown voltage MISFETQn1,Qp1 equipped with source-drain (n⁻ type semiconductor regions 13 and n⁺ type semiconductor regions, p⁻ type semiconductor regions 14 and p⁺ type semiconductor regions 18) having an LDD (Lightly Doped Drain) structure are formed in the low breakdown voltage regions (LN,LP). In the high breakdown voltage regions (HN,HP), on the other hand, the high breakdown voltage MISFETQn2,Qp2 are formed.

According to this Embodiment, thickness of the silicon oxide film 104 can be maintained so that generation of a recess can be reduced. This makes it possible to reduce lowering in breakdown voltage or generation of a kink effect due to the recess. Lowering in the breakdown voltage occurs owing to electric field effect concentration on the surface step portion of the silicon oxide film 104 formed owing to generation of recesses. The term "kink effect" means a phenomenon showing a double waveform in sub-threshold characteristics of MISFET (characteristics depending on the relation of gate voltage (abscissa) vs drain current (ordinate)), because the drain current becomes greater in a smaller gate voltage region.

FIG. 33(b) is an enlarged view of FIG. 33(a) and it includes a recess which was described with reference to FIG. 26(b).

A multilayer interconnect is formed by repeating formation of interlevel insulating films and a wiring metal over these MISFETQn1,Qn2,Qp1,Qp2. Over the uppermost interconnection layer, a protective film is formed to cover the whole chip, but its diagram and detailed description are omitted.

Embodiment 3

A manufacturing method of a semiconductor integrated circuit device of this Embodiment will next be described in the order of steps based on FIGS. 34 to 39.

Figure 34:
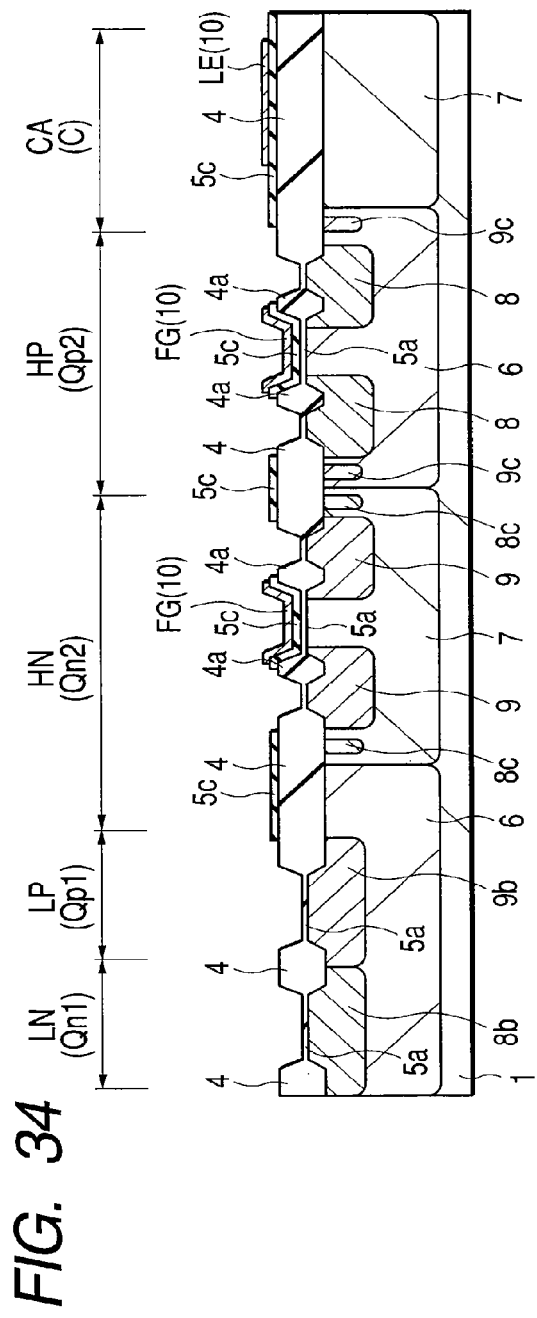
FIG. 34 is a fragmentary cross-sectional view of a substrate illustrating a manufacturing method of a semiconductor integrated circuit device according to Embodiment 3 of the present invention.

A semiconductor substrate 1 having a gate electrode FG formed over a gate insulating film 5 (5a,5c) of each of the high breakdown voltage MISFETQn2,Qp2 as illustrated in FIG. 34 is prepared. The manufacturing steps of this semiconductor substrate 1 are similar to those of Embodiment 1 which were described with reference to FIGS. 1 to 14 so that its explanation is omitted. Since the semiconductor substrate 1 as illustrated in FIG. 34 has a silicon oxide film 5c over silicon oxide films 104,104a, thickness of the silicon oxide film 104 can be maintained as in Embodiment 1 and the threshold voltage Vt of a parasitic MOS formed thereover can be increased.

Figure 35:
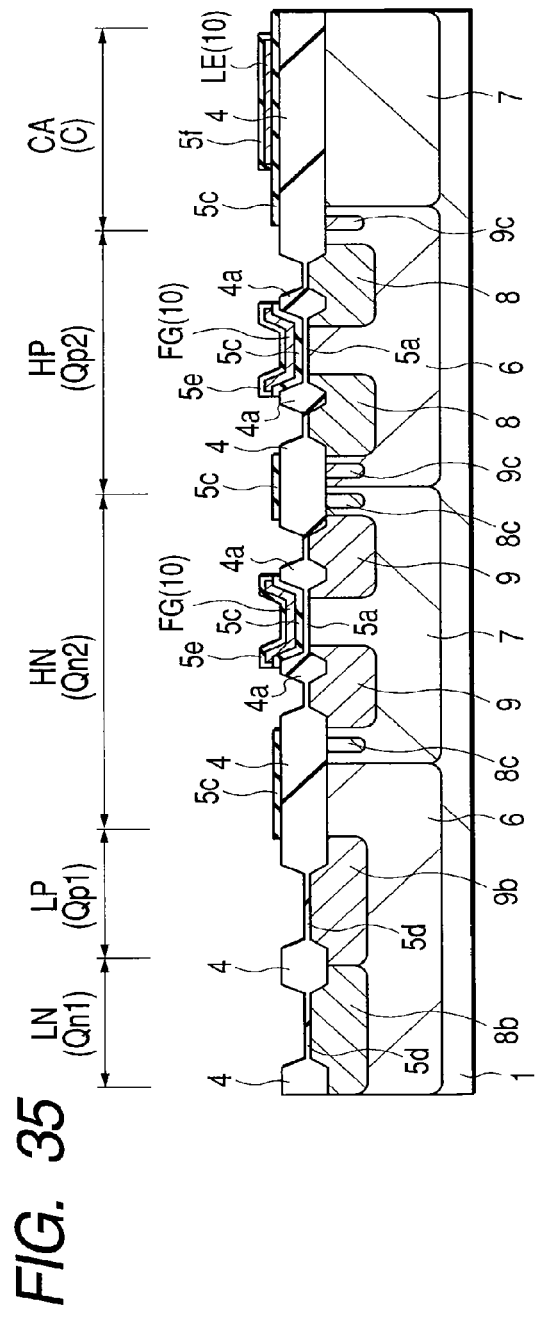
FIG. 35 is a fragmentary cross-sectional view of a substrate illustrating the manufacturing method of a semiconductor integrated circuit device according to Embodiment 3 of the present invention.

As illustrated in FIG. 35, after removal of the thin silicon oxide film 5a over the low breakdown voltage n channel type MISFET forming region LN and low breakdown voltage p channel type MISFET forming region LP, a gate insulating film 5d of each of the low breakdown voltage MISFETQn1, Qp1 is formed by thermal oxidation. At this time, a gate electrode FG of each of the high breakdown voltage MISFETQn2,Qp2 is slightly oxidized (5e). The surface of a lower electrode (LE) is also oxidized slightly, whereby a silicon oxide film (5f) is formed (FIG. 35). This silicon oxide film 5f serves as a capacitive insulating film of the capacitive element C. Alternatively, it is also possible to form in advance a silicon nitride film over a polycrystalline silicon film 10, which has been deposited as a lower electrode LE, and use it as a capacitive insulating film.

By heat treatment in a nitrogen atmosphere, the gate insulating film 5d is nitrided. By introducing nitrogen on the interface of the gate insulating film 5d in such a manner, fluctuations of the threshold voltage Vt due to hot carriers generated at the end of the drain can be suppressed.

Figure 36:
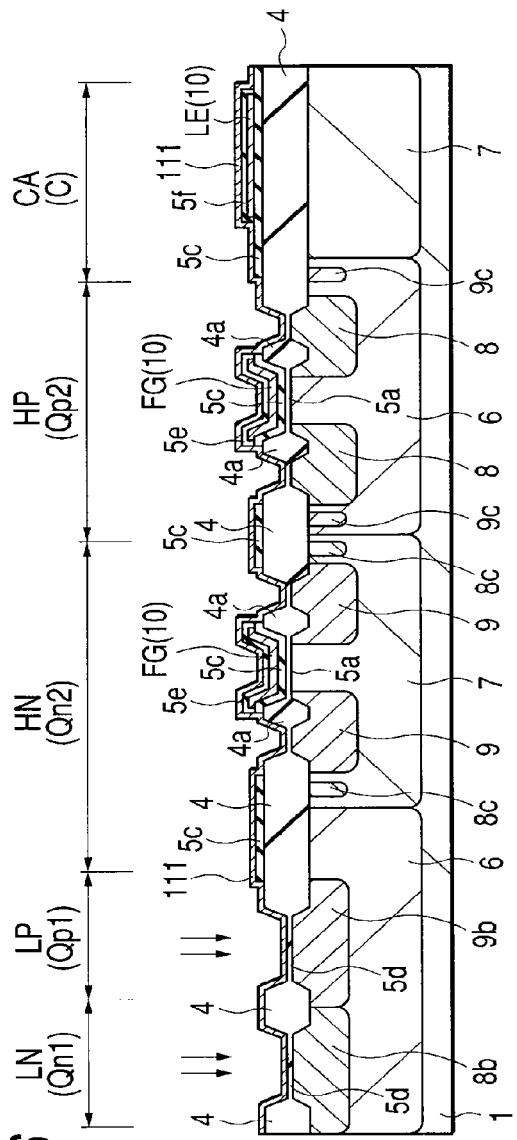
FIG. 36 is a fragmentary cross-sectional view of a substrate illustrating the manufacturing method of a semiconductor integrated circuit device according to Embodiment 3 of the present invention.

As illustrated in FIG. 36, a polycrystalline silicon film 111 is deposited over the semiconductor substrate 1 by CVD. This polycrystalline silicon film 111 will be a portion of a gate electrode SG of each of the low breakdown voltage MISFETQn1,Qp1.

If this nitriding treatment is conducted after an impurity implantation step for regulation of the threshold voltage Vt, which step will be described later, diffusion of the impurity occurs by this nitriding treatment, making it difficult to regulate the threshold voltage Vt. Even if the impurity implantation step comes after nitriding treatment, if the polycrystalline silicon film 111 is formed after this impurity implantation step, the impurity is implanted while the gate insulating film 5d is exposed, causing a problem of contamination of the gate insulating film 5d by heavy metals existing in the ion implantation apparatus.

As described below, an impurity is therefore ion-implanted over the semiconductor substrate 1 through the polycrystalline silicon film 111 while having the polycrystalline silicon film 111 formed over the gate insulating film 5d.

Figure 37:
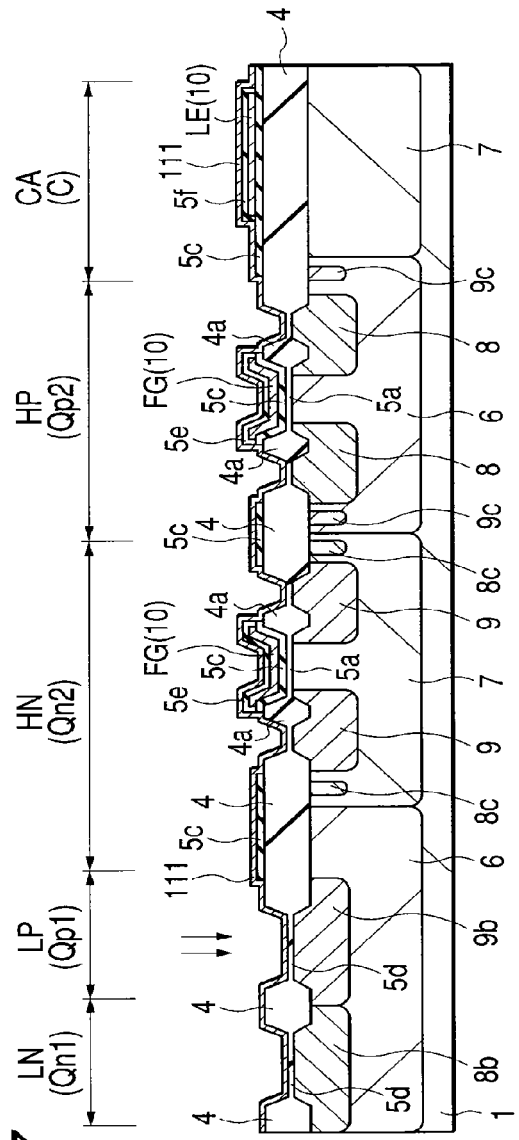
FIG. 37 is a fragmentary cross-sectional view of a substrate illustrating the manufacturing method of a semiconductor integrated circuit device according to Embodiment 3 of the present invention.

First, as illustrated in FIG. 36, an impurity is ion-implanted over the semiconductor substrate 1 in order to regulate the threshold voltage Vt of the low breakdown voltage MISFETQn1. Then, as illustrated in FIG. 37, another impurity is ion-implanted over the low breakdown voltage p channel type MISFET forming region LP. This impurity implantation is conducted to regulate the threshold voltage Vt of the low breakdown voltage MISFETQp1. At this time, the silicon oxide film 5e and polycrystalline silicon film 111 have been formed over the gate electrode FG of each of the high breakdown voltage MISFETQn2,Qp2 so that the impurity remains in these films and implantation of the impurity into the gate insulating film 5 (5a,5c) can be prevented.

When the impurity is implanted into the gate insulating film 5, a problem of so-called NBT (negative bias temperature) becomes prominent. This means a phenomenon that only by application of a negative potential to the gate electrode of the p channel type MISFET, its threshold voltage Vt increases. Particularly when the gate electrode is p type, this phenomenon stands out. This phenomenon is presumed to have a close relationship with the existence of boron in a gate insulating film and tends to occur when an impurity is contained in the gate insulating film.

In this Embodiment, however, implantation of an impurity into the gate insulating film 5 can be prevented, whereby generation of an NBT phenomenon can be reduced.

Figure 38:
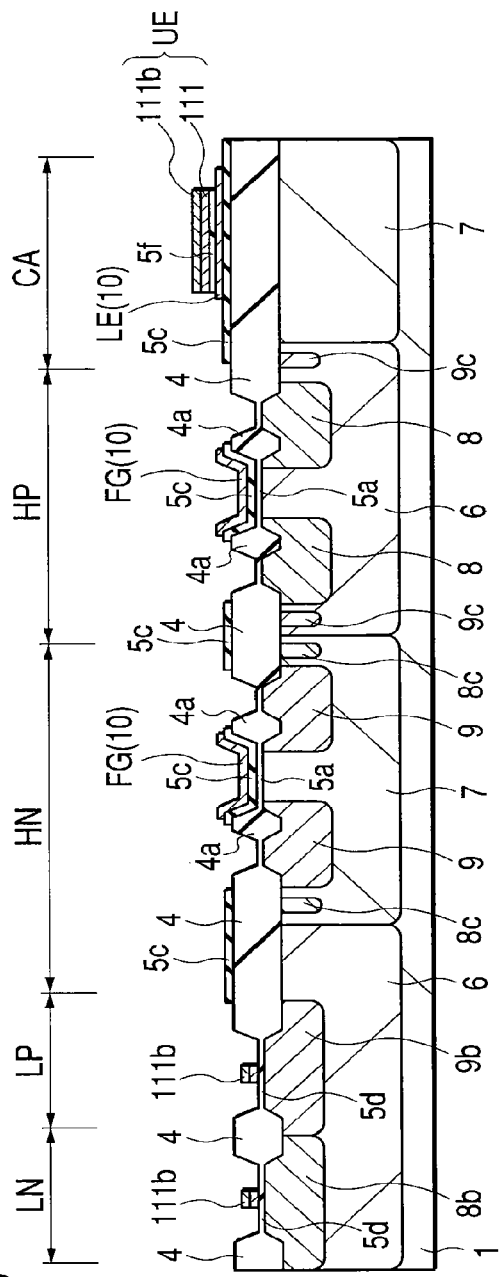
FIG. 38 is a fragmentary cross-sectional view of a substrate illustrating the manufacturing method of a semiconductor integrated circuit device according to Embodiment 3 of the present invention.

Over the polycrystalline silicon film 111, a polycrystalline silicon film 111b is then deposited. These polycrystalline silicon films 111,111b are to be gate a electrode SG of each of the low breakdown voltage MISFETQn1,Qp1. These polycrystalline silicon films 111,111b are therefore patterned to leave them over the gate insulating film 5d (FIG. 38). At this time, the polycrystalline silicon films 111,111b are also left over a silicon oxide film 5f over the lower electrode LE of the capacitive element forming region CA. These polycrystalline silicon films 111,111b are to be an upper electrode UE of the capacitive element C. Alternatively, the gate electrode SG may be formed by forming a tungsten silicide layer over the surface of the polycrystalline silicon film 111b, followed by patterning. This tungsten silicide layer is formed by depositing a metal film such as tungsten over the polycrystalline silicon film 111 and heat treating it. This silicide layer is formed to reduce resistance of the gate electrode SG.

It is also possible to remove only the polycrystalline silicon film 10 over the low breakdown voltage region (LN,LP) upon the above-described patterning of the polycrystalline silicon film 10 and carry out patterning of the polycrystalline silicon film 10 over the high breakdown voltage regions (HN,HP) after formation of the gate electrode SG.

The gate electrode SG of each of the low breakdown voltage MISFETQn1,Qp1 is made of a laminate of the polycrystalline silicon film 111 and polycrystalline silicon film 111b as described above, because implantation of an impurity for regulation of the threshold voltage of each of the low breakdown voltage MISFETQn1,Qp1 is carried out with good precision. In other words, impurity control is difficult and a desired threshold voltage Vt is not available in the case of ion implantation through a polycrystalline silicon film 111 which has a greater thickness.

As described above, when a silicide layer is formed over the gate electrode SG, a polycrystalline silicon film 111 constituting the gate electrode causes siliciding reaction of even silicon in the underlying gate insulating film if the polycrystalline silicon film is thin, resulting in lowering in the breakdown voltage of the gate insulating film 5d.

In this Embodiment, however, the gate electrode SG of each of the low breakdown voltage MISFETQn1,Qp1 is formed from a laminate of the polycrystalline silicon film 111 and polycrystalline silicon film 111b, making it possible to ion implanting, with good precision, an impurity for regulating the threshold voltage and to secure breakdown voltage of the gate insulating film 5d.

Then, source•drain regions of each of the low breakdown voltage MISFETQn1,Qp1 and high breakdown voltage MISFETQn2,Qp2 are formed. Steps thereafter are similar to those of Embodiment 1 described with reference to FIGS. 17 to 22 so that explanation on them is omitted.

In this Embodiment, as illustrated in FIG. 34, employed was the semiconductor substrate 1 having the silicon oxide film 5c formed over the field oxide film 4 in a future gate electrode region of each of the high breakdown voltage MISFETQn2,Qp2, high breakdown voltage n channel type MISFET forming region HN, high breakdown voltage p channel type MISFET forming region HP and capacitive element forming region CA. Even if the formation step of this silicon oxide film 5c is omitted, it is possible to prevent implantation of boron into the gate oxide film 5a, thereby suppressing generation of the above-described NBT phenomenon.

Figure 39:
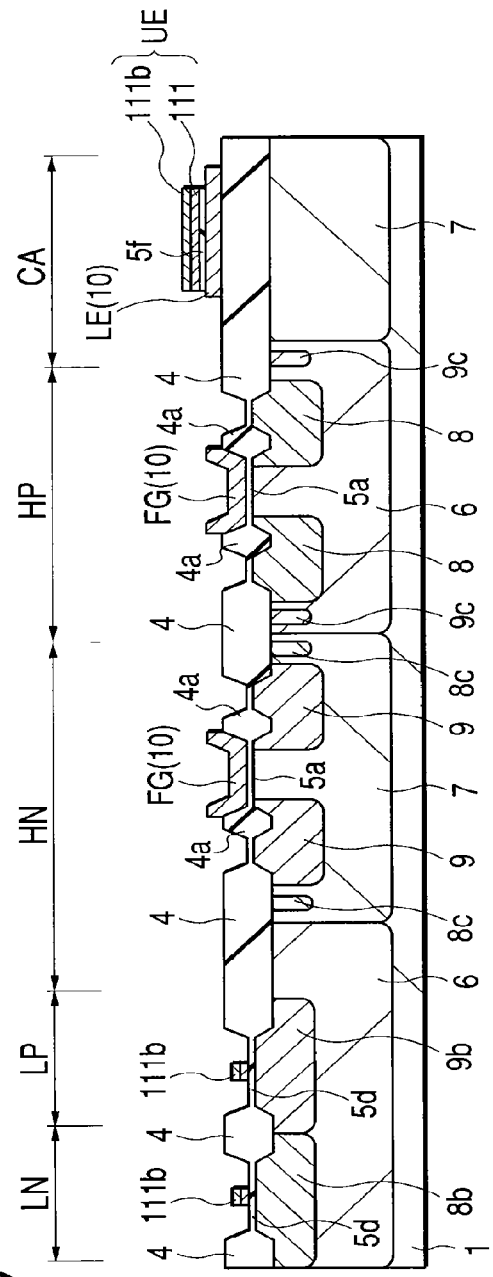
FIG. 39 is a fragmentary cross-sectional view of a substrate illustrating the manufacturing method of a semiconductor integrated circuit device according to Embodiment 3 of the present invention.
Figure 40:
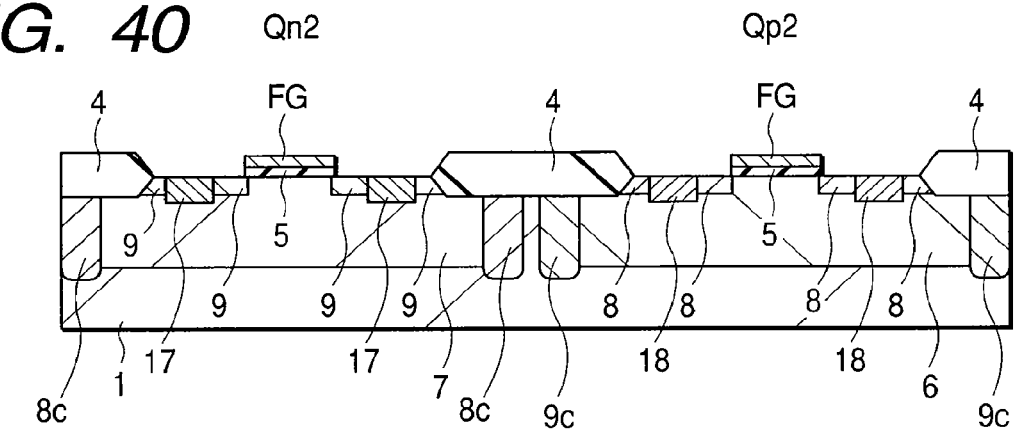
FIG. 40 is a diagram for illustrating a structure investigated as a solution to the problem of the present invention.
Figure 41:
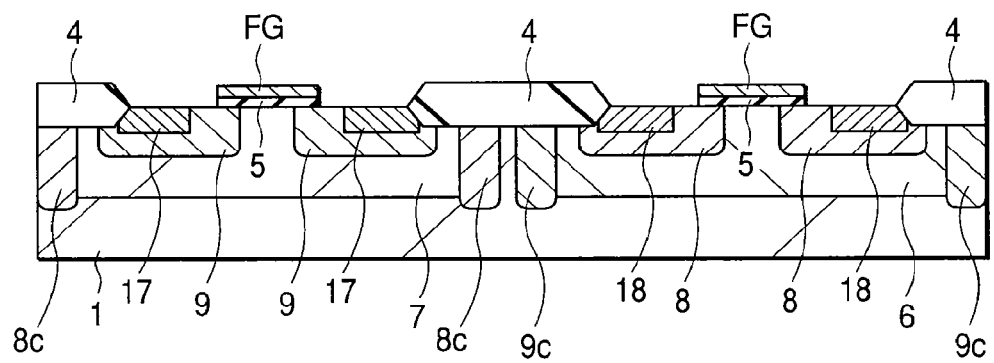
FIG. 41 is a diagram for illustrating another structure investigated as a solution to the problem of the present invention.
Figure 42:
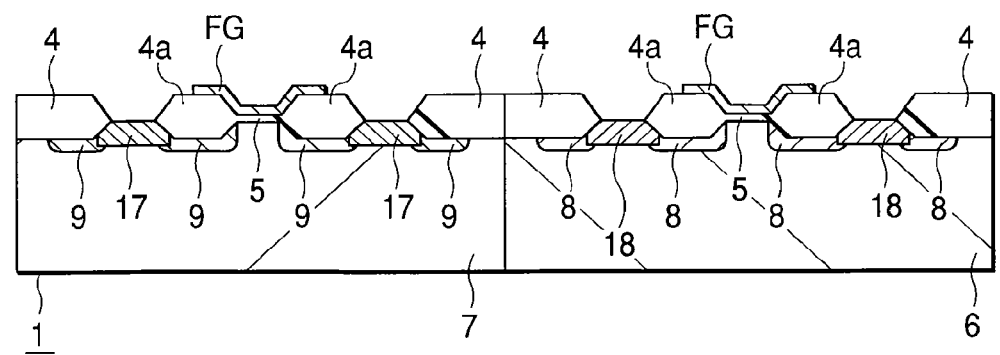
FIG. 42 is a diagram for illustrating a further structure investigated as a solution to the problem of the present invention.

FIG. 39 is a fragmentary cross-sectional view of a semiconductor substrate on which no silicon oxide film 5c has been formed. A manufacturing method of this semiconductor integrated circuit device is similar to that explained in Embodiment 1 (except the formation step of the silicon oxide film 5c) and in this Embodiment, so explanation of it is omitted.

The invention made by the present inventors was described specifically based on Embodiments. It will be obvious that the present invention is not limited by these Embodiments but various changes may be made within an extent not departing from the scope of the invention.

Advantages available with typical implementations of the present invention will next be described simply.

According to the present invention, a silicon oxide film 5c (third insulating film) is formed over a field oxide film 4 or a silicon oxide film 104 (first insulating film) formed in a groove, which makes it possible to increase the threshold voltage of a parasitic MOS formed over the field oxide film 4 or the like.

According to the present invention, impurity implantation for regulating the threshold voltage of a low breakdown voltage MISFET is conducted while having a conductive film (second conductive film) constituting a gate electrode of the low breakdown voltage MISFET over a gate electrode (first conductive film) of a high breakdown voltage MISFET, appearance of an NBT phenomenon can be suppressed.

According to the present invention, it is possible to form a high-performance miniaturized semiconductor integrated circuit device.

What is claimed is:

1. A method of manufacturing a semiconductor integrated circuit device having a first MISFET in a first MISFET forming region of a semiconductor substrate, comprising steps of:
   (a) forming grooves in the first MISFET forming region of the semiconductor substrate;
   (b) depositing a first insulating film over the first MISFET forming region of the semiconductor substrate;
   (c) polishing the first insulating film in order to embed the first insulating film into the grooves;
   (d) forming first semiconductor regions in the first MISFET forming region of the semiconductor substrate, wherein the first semiconductor regions serve as part of source and drain regions of the first MISFET;

(e) forming a first gate insulating film of the first MISFET over the first MISFET forming region of the semiconductor substrate by a thermal oxidation method;

(f) forming a second gate insulating film of the first MISFET over the first gate insulating film and the first insulating film by a CVD method;

(g) forming a first gate electrode of the first MISFET over the second gate insulating film; and (h) forming second semiconductor regions in the first MISFET forming region of the semiconductor substrate, wherein the second semiconductor regions serve as part of source and drain regions of the first MISFET, wherein the first MISFET is used for a driver of a liquid crystal display, wherein an impurity concentration of the second semiconductor regions is higher than an impurity concentration of the first semiconductor regions, wherein the first semiconductor regions surround the second semiconductor regions and the grooves, wherein a thickness of the second gate insulating film is thicker than a thickness of the first gate insulating film, wherein ends of the second gate insulating film are formed over the first insulating film in a direction from the source region to the drain region, and wherein ends of the first gate electrode are formed over the first insulating film through the second insulating film in a direction from the source region to the drain region.

2. A method of manufacturing a semiconductor integrated circuit device according to claim 1,
wherein the first and second semiconductor regions are formed of n-type impurities.

3. A method of manufacturing a semiconductor integrated circuit device according to claim 1,
wherein the first and second semiconductor regions are formed of p-type impurities.

4. A method of manufacturing a semiconductor integrated circuit device having a first MISFET in a first MISFET forming region of a semiconductor substrate, comprising steps of:

(a) forming grooves in the first MISFET forming region of the semiconductor substrate;

(b) depositing a first insulating film over the first MISFET forming region of the semiconductor substrate;

(c) polishing the first insulating film in order to embed the first insulating film into the grooves;

(d) forming first semiconductor regions in the first MISFET forming region of the semiconductor substrate, wherein the first semiconductor regions serve as part of source and drain regions of the first MISFET;

(e) forming a first gate insulating film of the first MISFET over the first MISFET forming region of the semiconductor substrate by a thermal oxidation method;

(f) forming a second gate insulating film of the first MISFET over the first gate insulating film and the first insulating film by a CVD method;

(g) forming a first gate electrode of the first MISFET over the second gate insulating film; and (h) forming second semiconductor regions in the first MISFET forming region of the semiconductor substrate, wherein the second semiconductor regions serve as part of source and drain regions of the first MISFET, wherein the first MISFET is used for a driver of a liquid crystal display, wherein an impurity concentration of the second semiconductor regions is higher than an impurity concentration of the first semiconductor regions, wherein the first semiconductor regions surround the second semiconductor regions and the grooves, wherein a thickness of the second gate insulating film is thicker than a thickness of the first gate insulating film, wherein ends of the second gate insulating film are formed over the first insulating film in a direction from the source region to the drain region, wherein ends of the first gate electrode are formed over the first insulating film through the second insulating film in a direction from the source region to the drain region, wherein the first insulating film, the first gate insulating film and the second gate insulating film are formed of a silicon oxide film, and wherein the gate electrode is formed of a poly silicon film and a silicide film formed on the poly silicon film.

5. A method of manufacturing a semiconductor integrated circuit device according to claim 4,
wherein the first and second semiconductor regions are formed of n-type impurities.

6. A method of manufacturing a semiconductor integrated circuit device according to claim 4,
wherein the first and second semiconductor regions are formed of p-type impurities.

* * * * *